US008835991B2

(12) United States Patent
Arakawa

(10) Patent No.: US 8,835,991 B2
(45) Date of Patent: Sep. 16, 2014

(54) SOLID-STATE IMAGE PICKUP DEVICE, METHOD OF MANUFACTURING SOLID-STATE IMAGE PICKUP DEVICE, AND ELECTRONIC APPARATUS

(71) Applicant: Sony Corporation, Tokyo (JP)

(72) Inventor: Shinichi Arakawa, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/927,863

(22) Filed: Jun. 26, 2013

(65) Prior Publication Data

US 2014/0015013 A1 Jan. 16, 2014

(30) Foreign Application Priority Data

Jul. 13, 2012 (JP) ................. 2012-157072

(51) Int. Cl.
H01L 31/00 (2006.01)
H01L 31/18 (2006.01)
H01L 27/148 (2006.01)

(52) U.S. Cl.
CPC .......... H01L 27/14818 (2013.01); H01L 31/18 (2013.01)
USPC ................. 257/230; 257/E31.001; 438/60

(58) Field of Classification Search
USPC ....... 257/229–231, 233, 24, E31.001; 438/60
See application file for complete search history.

(56) References Cited

U.S. PATENT DOCUMENTS

2013/0127003 A1* 5/2013 Arakawa ................ 257/435

FOREIGN PATENT DOCUMENTS

| JP | 2004-319959 | 11/2004 |
|---|---|---|
| JP | 2007-005493 | 1/2007 |
| JP | 2009-129931 | 6/2009 |
| JP | 2011-029835 A | 2/2011 |
| JP | 2011-198850 | 10/2011 |

* cited by examiner

Primary Examiner — Daniel Shook
(74) Attorney, Agent, or Firm — Sheridan Ross P.C.

(57) ABSTRACT

There is provided a solid-state image pickup device including a semiconductor substrate, and a plurality of pixel portions that are provided on the semiconductor substrate. Each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

14 Claims, 24 Drawing Sheets

PRIOR ART

FIG. 7
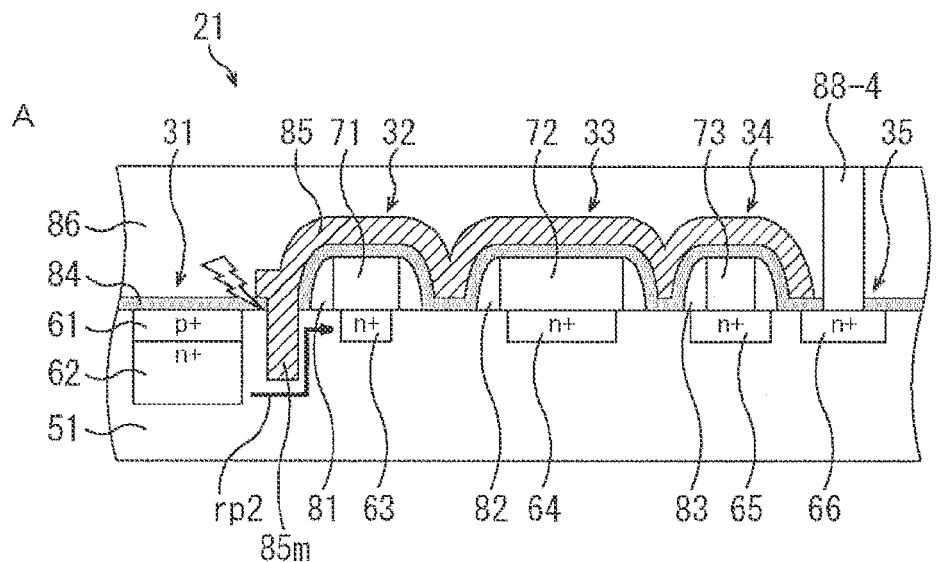
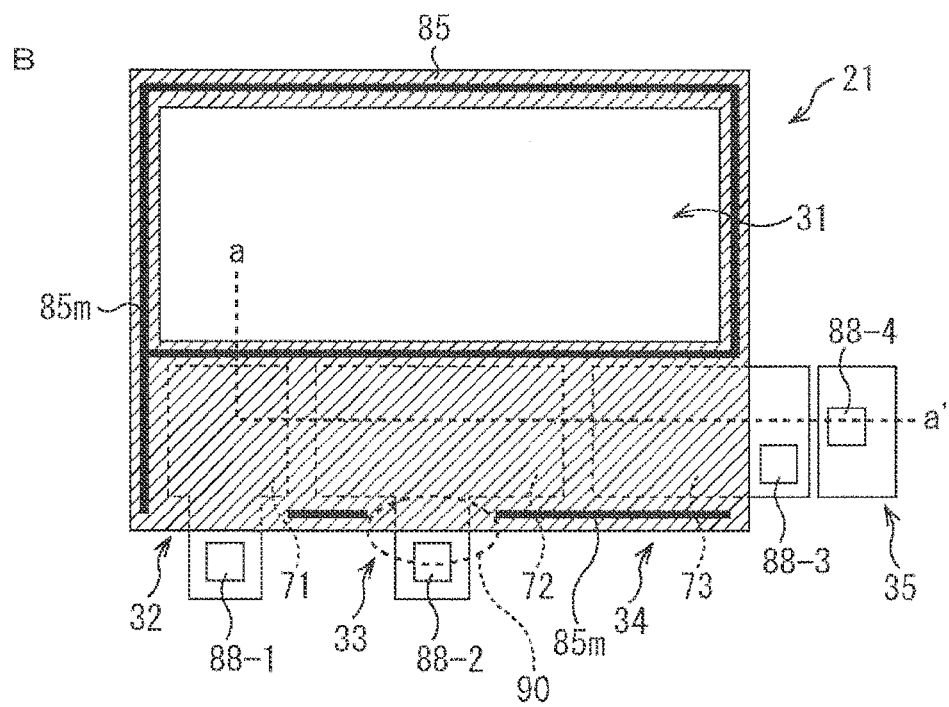
PRIOR ART

FIG. 8
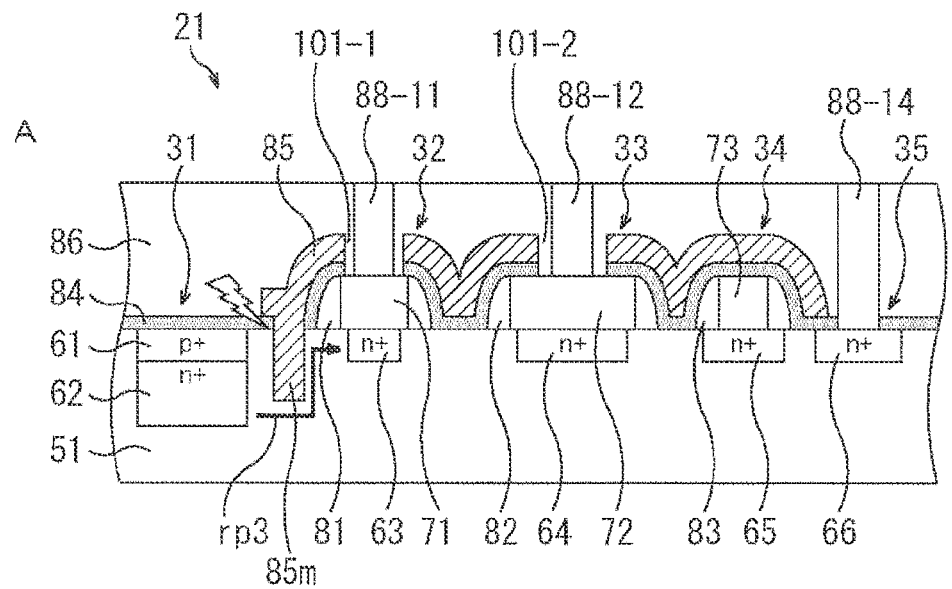
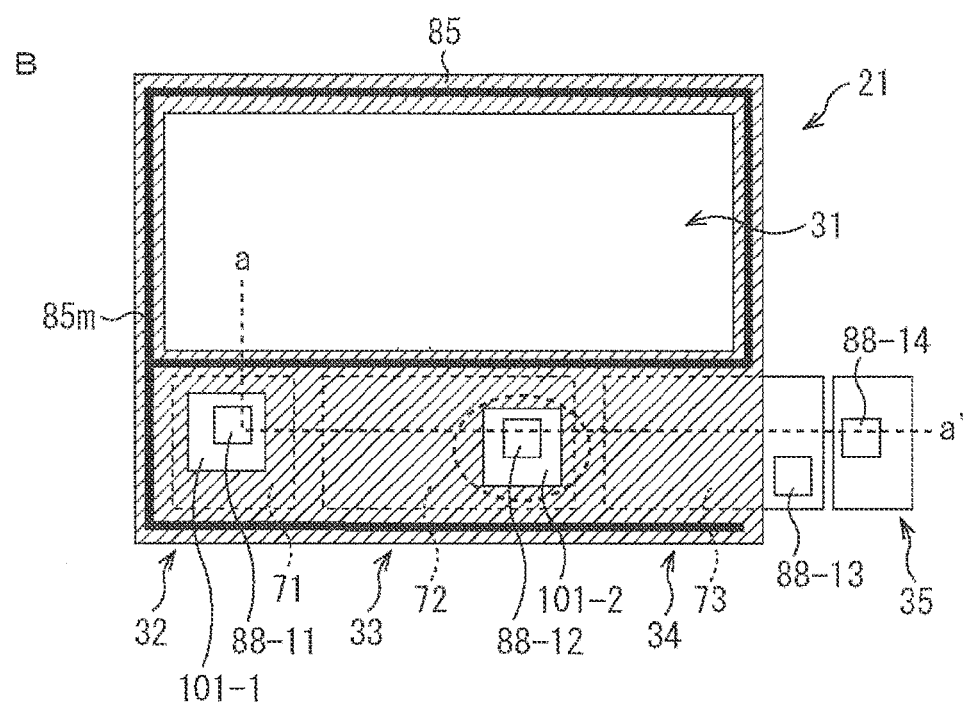
PRIOR ART

FIG. 20
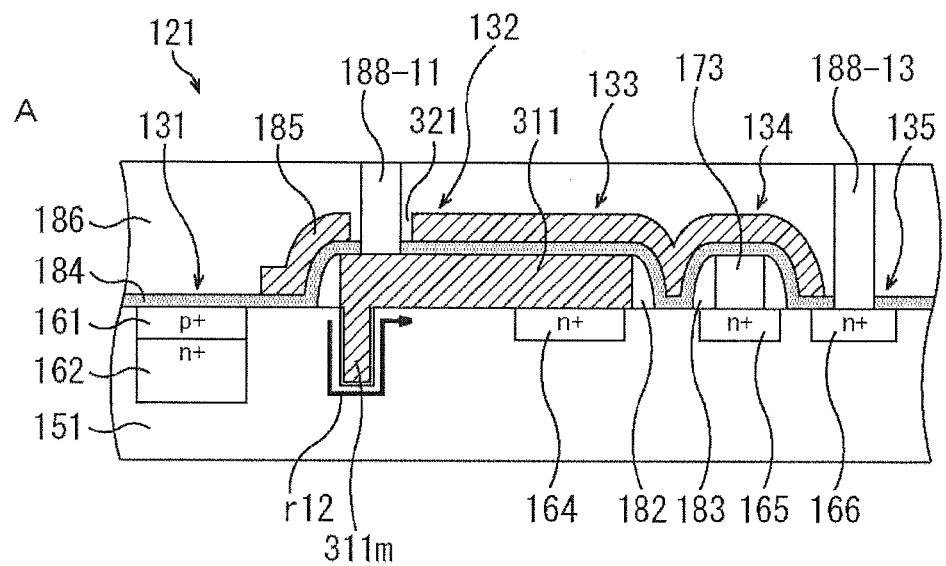
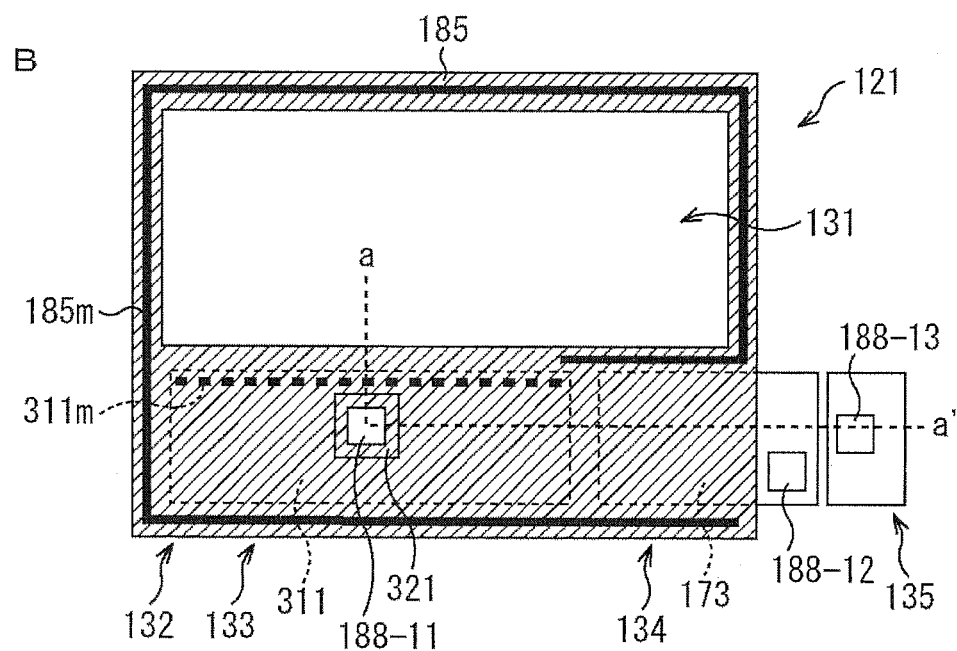

FIG. 22
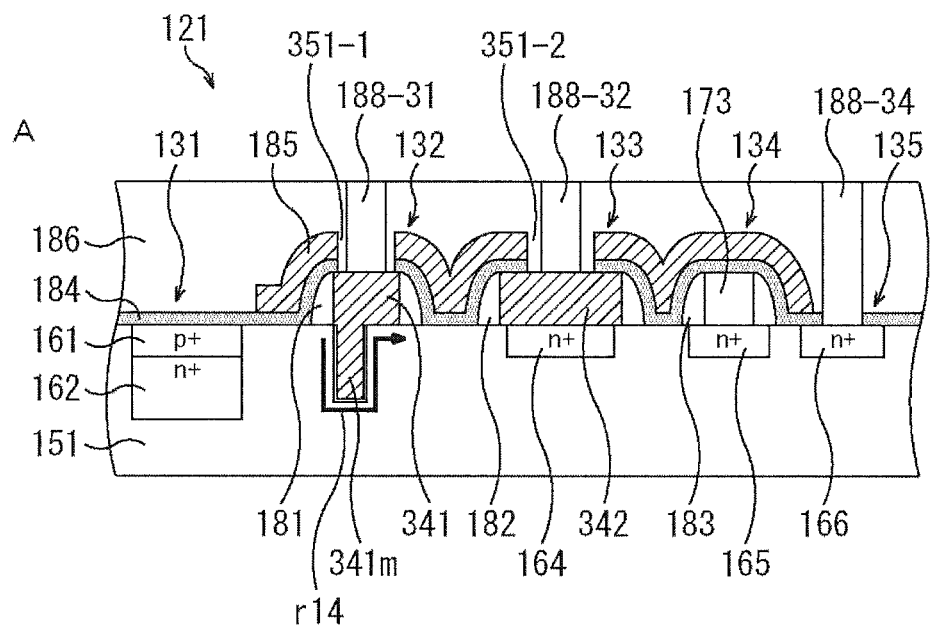
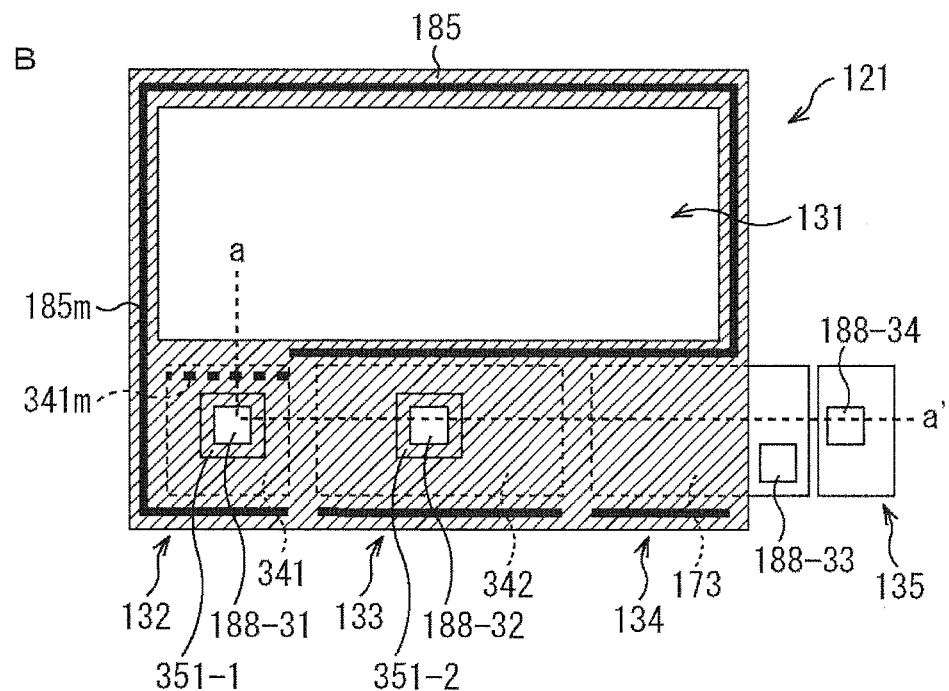

FIG. 23
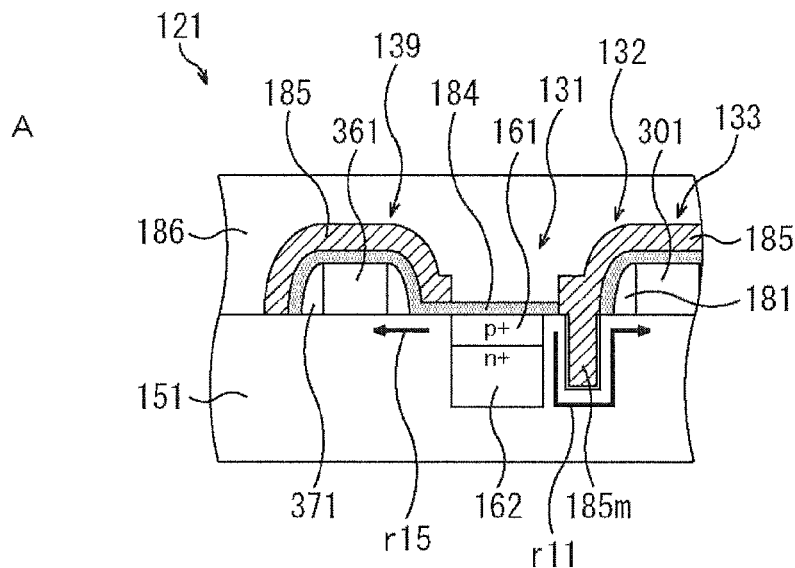
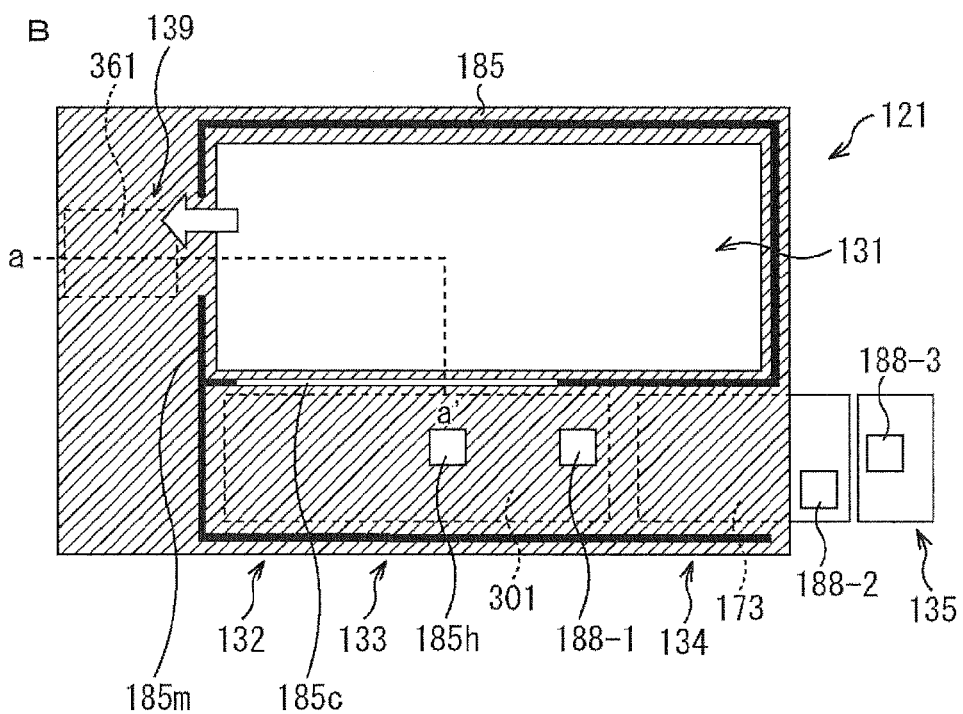

SOLID-STATE IMAGE PICKUP DEVICE, METHOD OF MANUFACTURING SOLID-STATE IMAGE PICKUP DEVICE, AND ELECTRONIC APPARATUS

BACKGROUND

The present disclosure relates to a solid-state image pickup device, a method of manufacturing a solid-state image pickup device, and an electronic apparatus and more particularly, to a solid-state image pickup device, a method of manufacturing a solid-state image pickup device, and an electronic apparatus that can realize both suppression of smear and an excellent transmission characteristic.

In the related art, in a digital still camera or a digital video camera, not only charge coupled device (CCD) image sensors but also complementary metal oxide semiconductor (CMOS) image sensors have been frequently adopted. Recently, an imaging function has been included in a mobile apparatus such as a mobile phone. A MOS-type image sensor has been mainly adopted as a solid-state image pickup device mounted to the mobile apparatus, from the viewpoint of a low power supply voltage and low consumption power. Therefore, a CMOS image sensor that is one type of the MOS-type image sensor will be described hereinafter.

For example, a CMOS image sensor in which a storage element (capacitor) is provided for each pixel to realize simultaneity of accumulation in each pixel and so-called global shutter imaging is enabled has been suggested in Japanese Patent Application Laid-Open (JP-A) No. 2011-29835. However, in the CMOS image sensor suggested in Japanese Patent Application Laid-Open (JP-A) No. 2011-29835 in which the global shutter imaging is enabled, smear may occur due to leakage of light in the storage element during charge retention and image quality may be deteriorated due to the smear.

Therefore, a first method of installing a light shielding film right above the storage element to shield the storage element from light and preventing leakage of the light has been known as a method according to the related art to suppress the smear.

In addition, a second method of digging the light shielding film installed right above the storage element into a semiconductor substrate and preventing the leakage of the light has been known as another method according to the related art to suppress the smear (for example, Japanese Patent Application Laid-Open (JP-A) Nos. 2009-129931, 2011-198850, 2007-5493, and 2004-319959).

SUMMARY

However, if the first method is applied, the smear may occur due to the leakage of the light from a region not provided with the light shielding film and the image quality may be deteriorated.

If the second method is applied, the leakage of the light from the region not provided with the light shielding film can be suppressed. However, it is necessary to perform transmission of charges at a deep position of the semiconductor substrate, which results in causing transmission deterioration or formation of a residual image.

As such, in the methods according to the related art including the first method and the second method, it is difficult to realize both suppression of the smear and an excellent transmission characteristic in the CMOS image sensor in which a memory unit is provided for each pixel and the global shutter imaging is enabled.

It is desirable to realize both suppression of smear and an excellent transmission characteristic.

According to an embodiment of the present technology, there is provided a solid-state image pickup device including a semiconductor substrate, and a plurality of pixel portions that are provided on the semiconductor substrate. Each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

The digging portion may be formed as a part of the light shielding portion between the photoelectric converting unit and the transmitting unit. The transmitting unit may be a transistor having a gate electrode. The gate electrode and the light shielding portion may be connected to form the channel for the transmission.

Each of the pixel portions may further include a contact portion that connects the gate electrode to a wiring line. The contact portion may be formed on the light shielding portion.

The transmitting unit may be a transistor having a gate electrode functioning as the digging portion.

Each of the pixel portions may further include a contact portion that connects the gate electrode to a wiring line. The contact portion may be formed on the gate electrode through a hole formed in the light shielding portion.

The photoelectric converting unit may be formed to be stacked in a plurality of steps in the semiconductor substrate.

The transmitting unit may be a transistor having a gate electrode. The digging portion may have a first digging portion formed as a part of the light shielding portion between the photoelectric converting unit and the transmitting unit and a second digging portion formed in the gate electrode. The gate electrode and the light shielding portion may be connected to form the channel for the transmission.

Each of the pixel portions may further include a contact portion that connects the gate electrode to a wiring line. The contact portion may be formed on the light shielding portion.

Each of the pixel portions may further include a contact portion that connects the gate electrode to a wiring line. The contact portion may be formed on the gate electrode through a hole formed in the light shielding portion.

The digging portion may be formed to surround the photoelectric converting unit. The channel for the transmission in the transmitting unit may be formed in a region of the digging portion between the photoelectric converting unit and the memory unit.

Each of the pixel portions may further include a transistor having an overflow gate that, when charges of an amount equal to or more than a predetermined charge amount are generated in the photoelectric converting unit, discharges a part of the charges to a power supply potential. The digging portion may be not formed or digs to be shallower than another place, in a channel forming region with respect to the overflow gate.

Each of the pixel portions may further include a transistor having an overflow gate that, when charges of an amount equal to or more than a predetermined charge amount are generated in the photoelectric converting unit, discharges a part of the charges to a power supply potential. The digging portion may be further formed in the overflow gate.

According to an embodiment of the present technology, there is provided a method of manufacturing a solid-state image pickup device, including manufacturing a semiconductor substrate, and manufacturing a plurality of pixel portions provided on the semiconductor substrate. Each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

According to an embodiment of the present technology, there is provided an electronic apparatus including a solid-state image pickup device. The solid-state image pickup device includes a semiconductor substrate and a plurality of pixel portions that are provided on the semiconductor substrate. Each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

According to one embodiment of the present disclosure, the semiconductor substrate and the plurality of pixel portions provided on the semiconductor substrate are included. The pixel portion includes the photoelectric converting unit that generates the charges on the basis of the incident light, the memory unit that accumulates the charges generated by the photoelectric converting unit, the light shielding portion that shields at least the memory unit from light, the digging portion that digs into the semiconductor substrate between the photoelectric converting unit and the memory unit and is formed of the light shielding material, and the transmitting unit that transmits the charges from the photoelectric converting unit to the memory unit, by forming the channel for the transmission in the digging portion.

According to the embodiments of the present disclosure described above, both suppression of smear and an excellent transmission characteristic can be realized.

BRIEF DESCRIPTION OF THE DRAWINGS

FIG. 7 is a top surface layout diagram of a pixel to which the second method is applied;

FIG. 8 is a cross-sectional view and a top surface layout diagram of a pixel to which a third method is applied;

FIG. 20 is a cross-sectional view and a top surface layout diagram of a pixel according to a seventh embodiment;

FIG. 22 is a cross-sectional view of a pixel according to a ninth embodiment and a top surface layout diagram of an arrangement of contact portions;

FIG. 23 is a cross-sectional view of a pixel according to a tenth embodiment and a top surface layout diagram of an arrangement of contact portions.

DETAILED DESCRIPTION OF THE EMBODIMENT(S)

Figure 1:
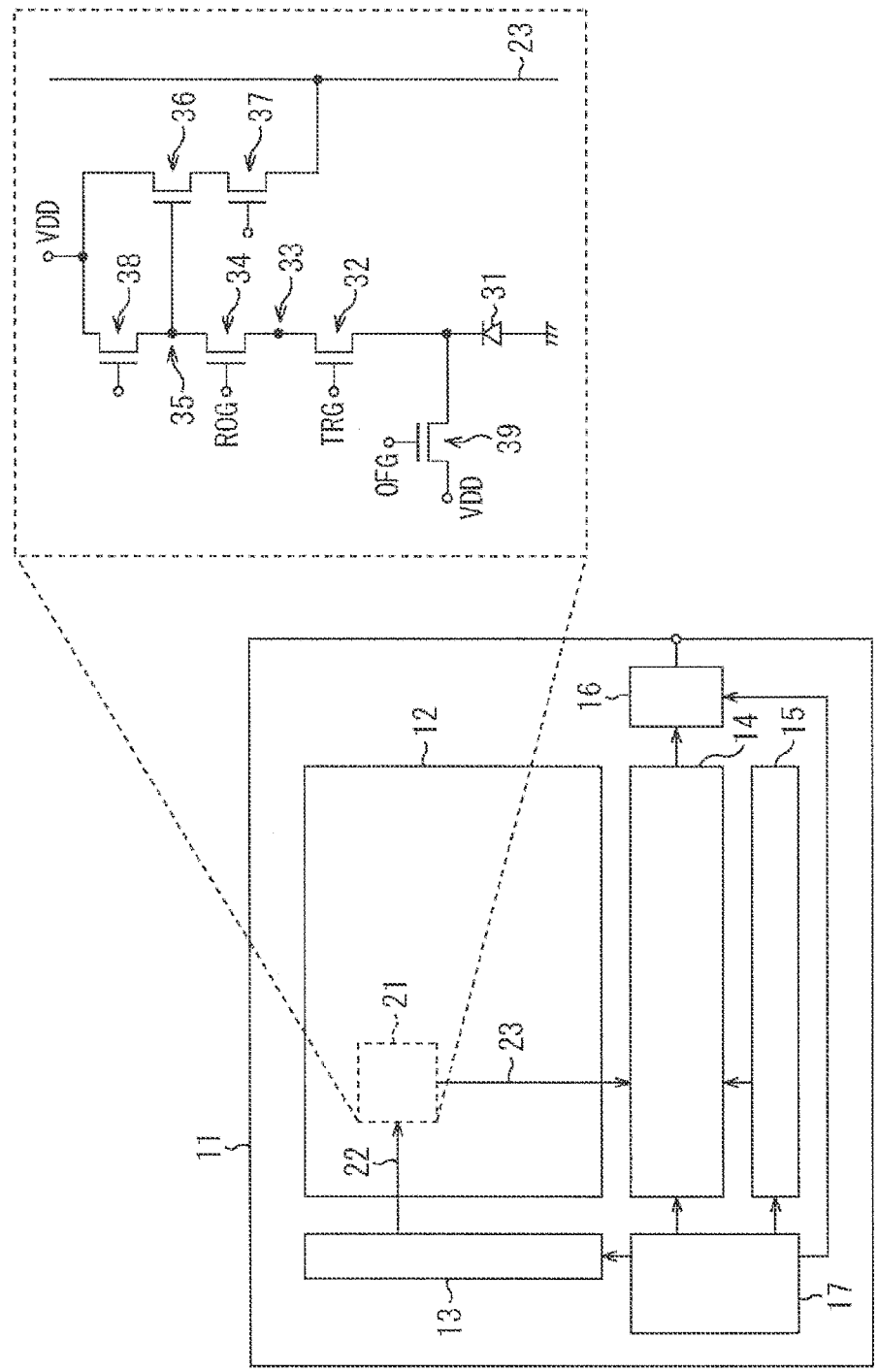
FIG. 1 is a block diagram illustrating a configuration example of an image pickup device according to the related art.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

[Configuration Example of Image Pickup Device according to Related Art]

FIG. 1 is a block diagram illustrating a configuration example of an image pickup device according to the related art. In the basic configuration example, the first method or the second method according to the related art is applied.

An image pickup device 11 is configured as a CMOS image sensor and includes a pixel array unit 12, a vertical driving unit 13, a column processing unit 14, a horizontal driving unit 15, an output unit 16, and a driving control unit 17.

The pixel array unit 12 is configured by arranging a plurality of pixels 21 regularly in an array shape. In this case, lines of pixels of a group of the pixels 21 arranged in the array shape, which correspond to a horizontal direction of an image, are referred to as rows and lines of pixels of the group of the pixels 21, which correspond to a vertical direction of the image, are referred to as columns. The pixel array unit 12 is connected to the vertical driving unit 13 by a horizontal signal line 22 for each row of the group of the pixels 21. In addition, the pixel array unit 12 is connected to the column processing unit 14 by a vertical signal line for each column of the group of the pixels 21. That is, in the pixel array unit 12, one pixel 21 is arranged at an intersection of the horizontal signal line 22 and the vertical signal line 23.

The vertical driving unit 13 sequentially supplies driving signals (a transmission signal, a read signal, a selection signal, a reset signal, and the like) to drive each pixel 21 to each row of the plurality of pixels 21 included in the pixel array unit 12, through the horizontal signal line 22.

The column processing unit 14 executes correlated double sampling (CDS) processing with respect to a pixel signal output from each pixel 21 through the vertical signal line 23, extracts a signal level of the pixel signal, and acquires pixel data according to a light reception amount of the pixel 21.

The horizontal driving unit 15 sequentially supplies, to the column processing unit 14, driving signals to sequentially output the pixel data acquired from each pixel 21 from the column processing unit 14, for each column of the plurality of pixels 21 included in the pixel array unit 12.

The pixel data is supplied from the column processing unit 14 to the output unit 16 at timing according to the driving signal of the horizontal driving unit 15. The output unit 16 amplifies the supplied pixel data and outputs the pixel data to an image processing circuit of a rear step.

The driving control unit 17 controls driving of each block in the image pickup device 11. For example, the driving control unit 17 generates a clock signal according to a driving cycle of each block and supplies the clock signal to each block.

The pixel 21 includes a photodiode (PD) 31, a transmission transistor 32, a memory unit 33, a read transistor 34, a floating diffusion (FD) 35, an amplification transistor 36, a selection transistor 37, a first reset transistor 38, and a second reset transistor 39.

The PD 31 is a photoelectric converting unit. The PD 31 receives light radiated to the pixel 21, generates charges according to an amount of the received light, and accumulates the charges.

If the transmission transistor 32 is driven according to a transmission signal supplied from the vertical driving unit 13 to a transmission gate electrode (TRG) and is turned on, the charges that are accumulated in the PD 31 are transmitted to the memory unit 33. In this case, in the image pickup device 11, the transmission of the charges from the PD 31 to the memory unit 33 is performed at the same time (that is, at the same timing) in all PDs 31.

The memory unit 33 temporarily accumulates the charges that are transmitted from the PD 31 through the transmission transistor 32.

If the read transistor 34 is driven according to a read signal supplied from the vertical driving unit 13 to a read gate electrode (ROG) and is turned on, the charges that are accumulated in the memory unit 33 are read out to the FD 35.

The FD 35 is a floating diffusion region that is formed at a connection point of the read transistor 34 and a gate electrode of the amplification transistor 36 and has a predetermined capacity. The FD 35 accumulates the charges that are read from the memory unit 33 through the read transistor 34.

The amplification transistor 36 is connected to a power supply potential VDD and outputs a pixel signal having a level according to the charges accumulated in the FD 35.

If the selection transistor 37 is driven according to a selection signal supplied from the vertical driving unit 13 and is turned on, the pixel signal that is output from the amplification transistor 36 can be output to the vertical signal line 23 through the selection transistor 37.

If the first reset transistor 38 is driven according to a reset signal supplied from the vertical driving unit 13 and is turned on, the charges that are accumulated in the FD 35 are discharged to the power supply potential VDD through the first reset transistor 38. Thereby, the FD 35 is reset to the power supply potential VDD.

When the charges of an amount equal to or more than a predetermined charge amount are generated in the PD 31, the second reset transistor 39 functions as an overflow gate to discharge the charges to the power supply potential VDD.

The pixel 21 is configured to include the selection transistor 37. However, the pixel 21 may adopt a circuit configuration (so-called three transistor configuration) in which the selection transistor 37 is omitted.

[Configuration Example of Pixel to which First Method is Applied]

Figure 2:
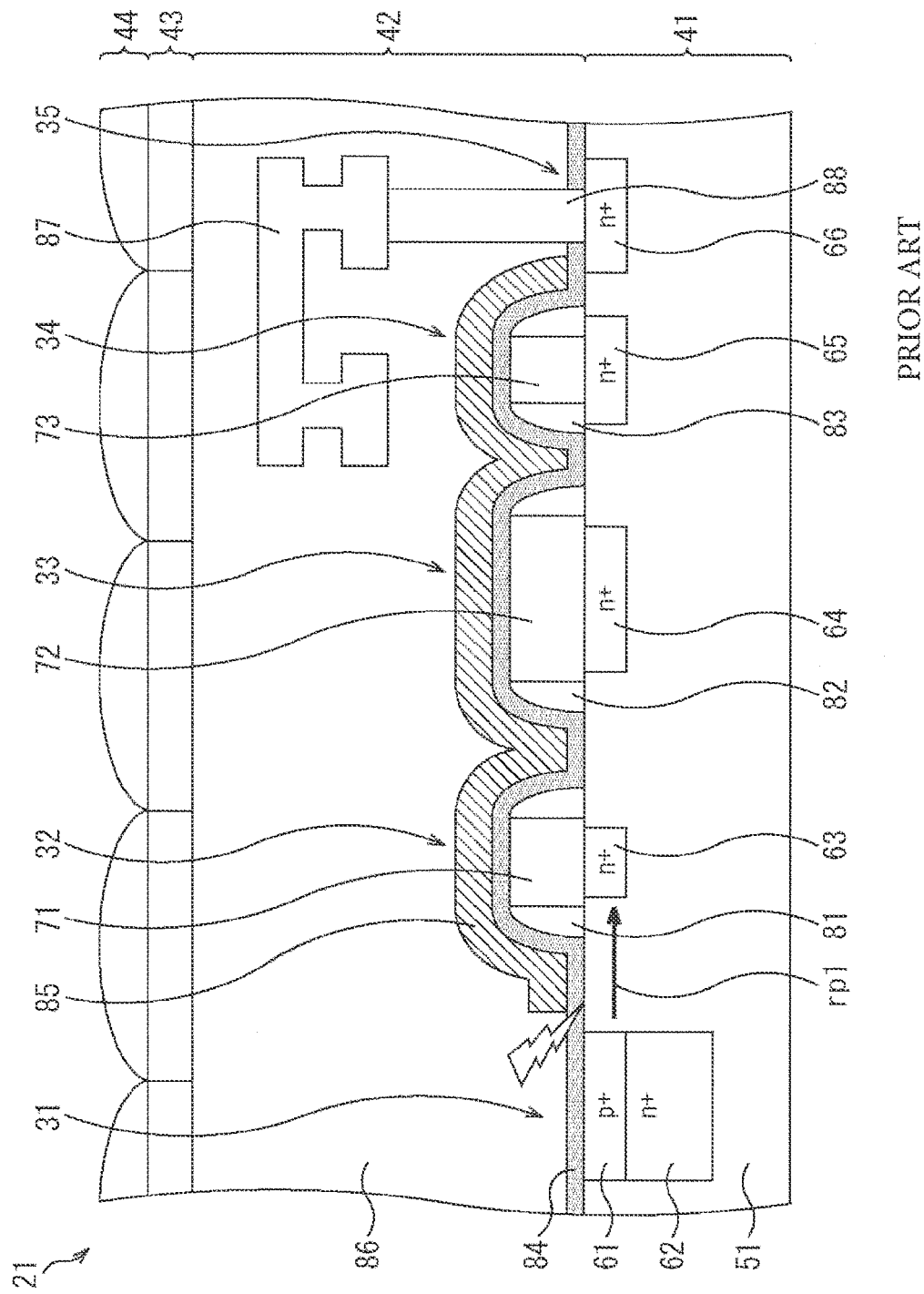
FIG. 2 is a cross-sectional view illustrating a configuration example of a pixel to which a first method according to the related art is applied.

FIG. 2 is a cross-sectional view illustrating a configuration example of the pixel 21 to which the first method is applied.

As illustrated in FIG. 2, the pixel 21 is configured by stacking a semiconductor substrate 41, a wiring layer 42, a color filter layer 43, and an on-chip lens layer 44. In the color filter layer 43, filters to transmit red light, blue light, and green light are arranged for each pixel 21. In the on-chip lens layer 44, a plurality of small lenses are arranged.

In the semiconductor substrate 41, a P-type region 61 and an N-type region 62 of the PD 31, an N-type region 63 of the transmission transistor 32, an N-type region 64 of the memory unit 33, an N-type region 65 of the read transistor 34, and an N-type region 66 of the FD 35 are formed in a P-type silicon layer (P well) 51.

In the wiring layer 42, a gate electrode 71 of the transmission transistor 32, a gate electrode 72 of the memory unit 33, and a gate electrode 73 of the read transistor 34 are formed through a gate insulating film (not illustrated in the drawings) formed on a surface of the semiconductor substrate 41. The gate electrode 71 is formed of polysilicon and is stacked on a portion of the semiconductor substrate 41 in which the N-type region 63 is formed. The gate electrode 72 is formed of polysilicon and is stacked on a portion of the semiconductor substrate 41 in which the N-type region 64 is formed. The gate electrode 73 is formed of polysilicon and is stacked on a portion of the semiconductor substrate 41 in which the N-type region 65 is formed.

In the wiring layer 42, sidewalls 81 to 83 are formed to surround sides of the gate electrodes 71 to 73. A liner film 84 is formed to cover the semiconductor substrate 41, the gate electrodes 71 to 73, and the sidewalls 81 to 83. In the wiring layer 42, a light shielding metal 85 is formed to cover an entire region of the transmission transistor 32, the memory unit 33, and the read transistor 34 through the liner film 84. An interlayer insulating film 86 is formed to be stacked on the light shielding metal 85. In the interlayer insulating film 86, a wiring line 87 and a contact portion 88 are formed. The contact portion 88 is formed to connect the wiring line 87 and the N-type region 66.

In the pixel 21, a transmission path rP1 from the PD 31 to the gate electrode 72 of the memory unit 33 is shown by an arrow.

As such, the pixel 21 can prevent leakage of the light to the memory unit 33, by the light shielding metal 85 formed right above the memory unit 33. However, in the pixel 21, because light from a side of the PD 31 not provided with the light shielding metal 85 leaks in the memory unit 33, image quality may be deteriorated.

For this reason, the second method of digging the light shielding metal 85 into the semiconductor substrate 41 to suppress the leakage of the light from the side of the PD 31 is known. Next, a configuration example of the pixel 21 of the image pickup device 11 to which the second method is applied will be described.

[Configuration Example of Pixel to which Second Method is Applied]

Figure 3:
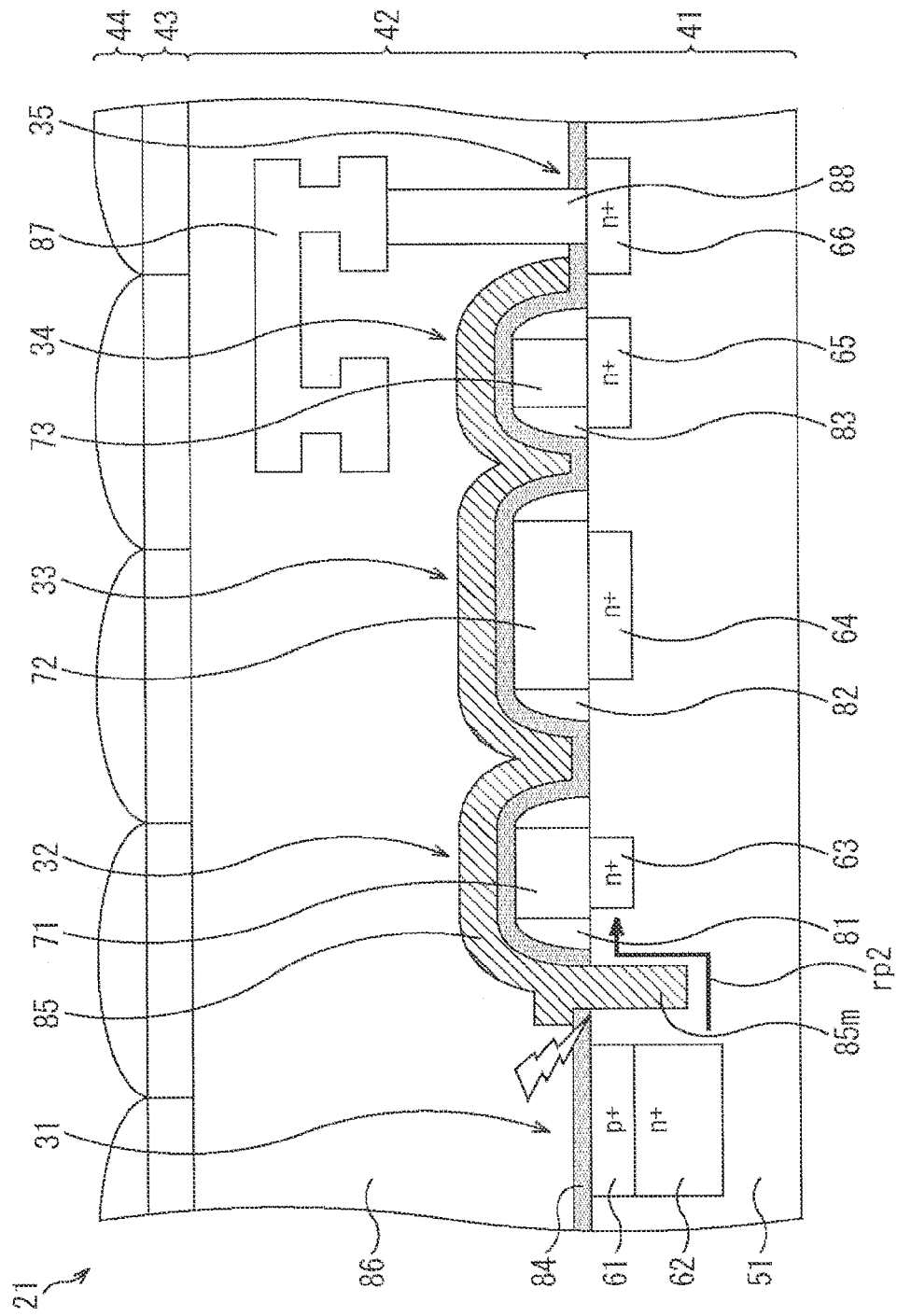
FIG. 3 is a cross-sectional view illustrating a configuration example of a pixel to which a second method according to the related art is applied.

FIG. 3 is a cross-sectional view illustrating a configuration example of the pixel 21 to which the second method is applied. In FIG. 3, structural elements that are common to the structural elements of the pixel 21 of FIG. 2 to which the first method is applied are denoted with the same reference numerals and detailed explanation thereof is omitted.

As illustrated in FIG. 3, in the pixel 21, the light shielding metal 85 is formed to cover an entire region of the transmission transistor 32, the memory unit 33, and the read transistor 34. One end of the light shielding metal 85 is configured to penetrate the liner film 84 and dig into the semiconductor substrate 41. Therefore, a portion having the above configuration in the light shielding metal 85 is referred to as a light shielding metal digging portion 85m hereinafter.

In the pixel 21 of FIG. 3, because the light shielding metal 85 is configured to have the light shielding metal digging portion 85m, the leakage of the light from the side of the PD 31 can be suppressed.

In the pixel 21, a transmission path rP2 from the PD 31 to the gate electrode 72 of the memory unit 33 is shown by an arrow. The transmission path rP2 passes a surrounding portion of a lower side of the light shielding metal digging portion 85m.

[Method of Manufacturing Image Pickup Device to which Second Method is Applied]

Next, a method of manufacturing the image pickup device 11 having the pixel 21 to which the second method is applied will be described with reference to FIGS. 4 to 6. Processes for manufacturing the image pickup device 11 may be distributed to a plurality of apparatuses and the image pickup device 11 may be manufactured by the plurality of apparatuses. However, in this case, it is assumed that one manufacturing apparatus executes a series of processes to manufacture the image pickup device 11, in order to simplify explanation.

Figure 4:
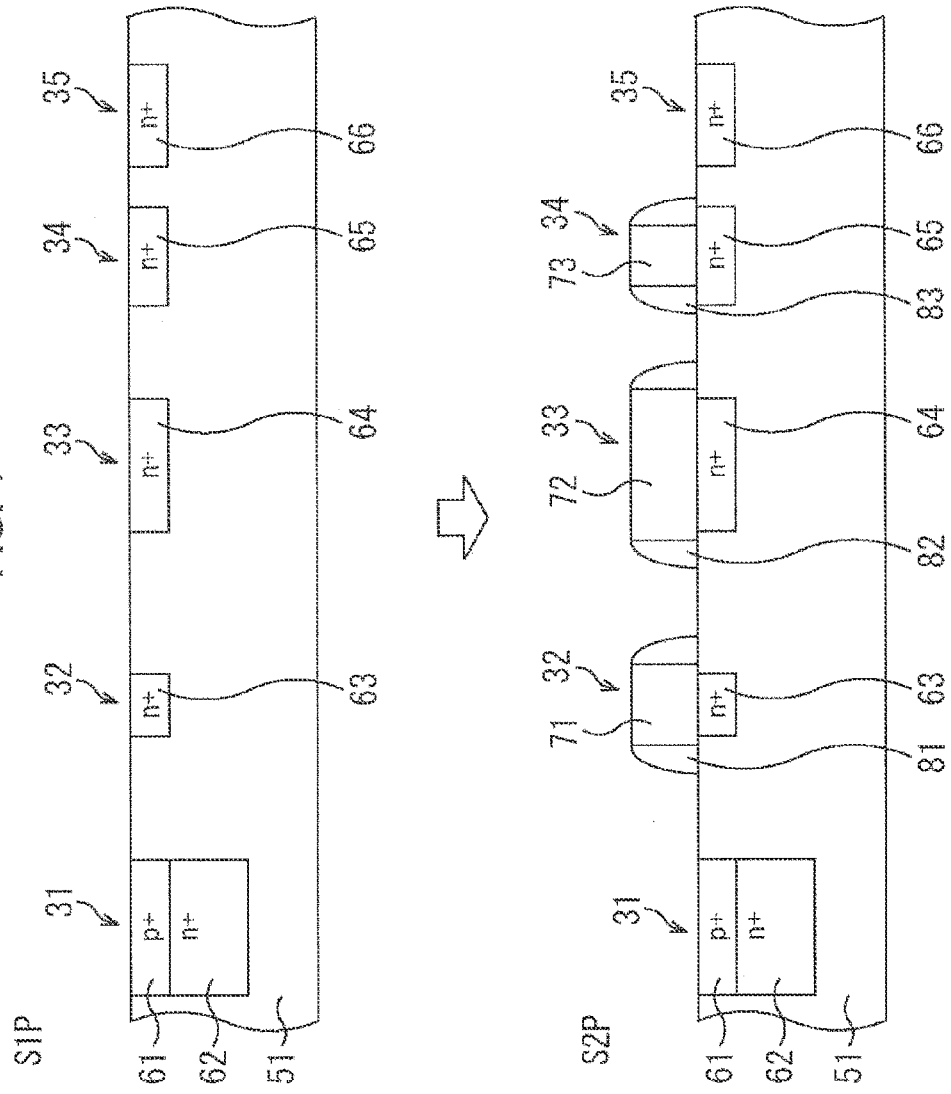
FIG. 4 is a diagram illustrating a method of manufacturing an image pickup device to which the second method is applied.

First, as illustrated in FIG. 4, in step S1P, the manufacturing apparatus performs lithography and ion implantation on the silicon layer 51 becoming the semiconductor substrate 41 and forms the P-type region 61, the N-type region 62, and the N-type regions 63 to 66 in desired places.

In step S2P, the manufacturing apparatus forms the gate electrodes 71 to 73 and the sidewalls 81 to 83.

Figure 5:
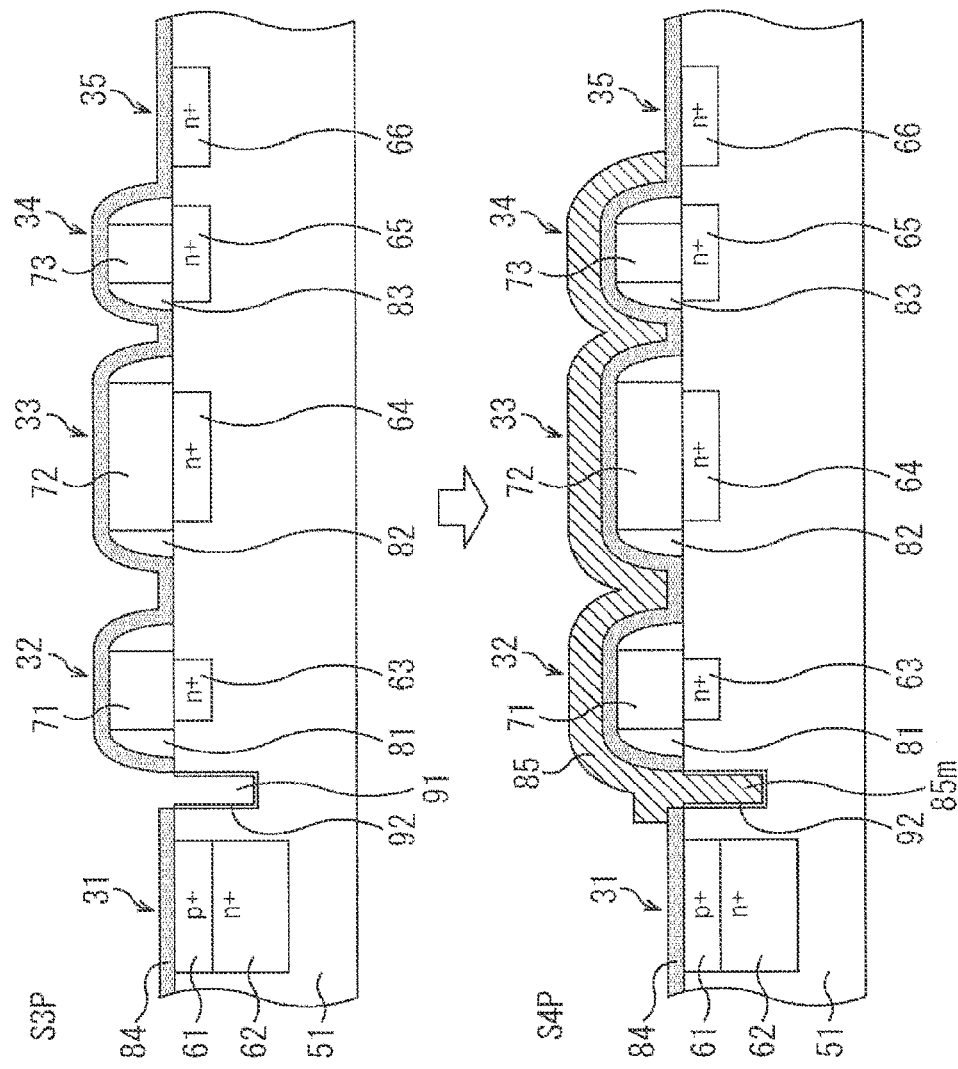
FIG. 5 is a diagram illustrating a method of manufacturing an image pickup device to which the second method is applied.

Next, as illustrated in FIG. 5, in step S3P, the manufacturing apparatus forms the liner film 84 on an entire surface. In order to form the light shielding metal digging portion 85m, the manufacturing apparatus forms a hole in the liner film 84 of the side of the PD 31 to be a formation position of the light shielding metal digging portion 85m and forms a groove 91 in the semiconductor substrate 41 of a lower position of the hole.

Then, the manufacturing apparatus forms an oxide film 92 on a surface of the groove 91 to insulate the light shielding metal 85 and a portion of the semiconductor substrate 41 corresponding to the groove 91 from each other.

In step S4P, the manufacturing apparatus forms the light shielding metal 85. At this time, the manufacturing apparatus implants a part of the light shielding metal 85 into the groove 91 formed in step S3P and forms the light shielding metal digging portion 85m.

Figure 6:
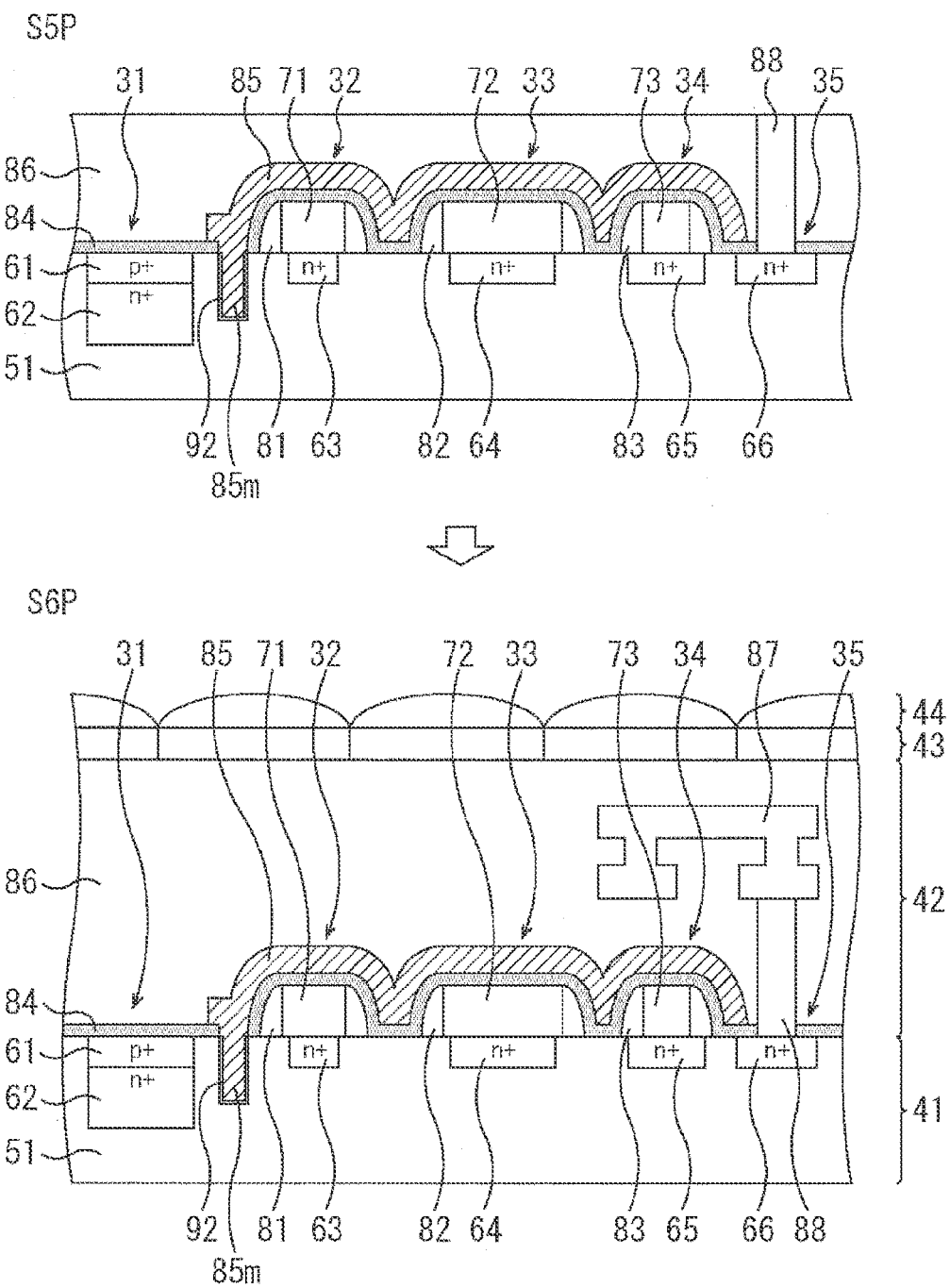
FIG. 6 is a diagram illustrating a method of manufacturing an image pickup device to which the second method is applied.

Next, as illustrated in FIG. 6, in step S5P, the manufacturing apparatus forms the interlayer insulating film 86 and executes flattening processing by chemical mechanical polishing (CMP).

Then, the manufacturing apparatus performs patterning of the contact portion 88 by the lithography and performs processing by dry etching. The manufacturing apparatus forms a barrier metal film and a tungsten film, removes a blanket portion by etch-back or the CMP, and forms the contact portion 88.

In step S6P, the manufacturing apparatus forms the color filter layer 43 and the on-chip lens layer 44, after forming the necessary wiring line 87. Thereby, the image pickup device 11 to which the second method is applied is finished.

In the pixel 21 of the image pickup device 11 that is manufactured as described above, because the light shielding metal 85 is configured to have the light shielding metal digging portion 85m, the leakage of the light from the side of the PD 31 can be suppressed.

[Top Surface Layout of Pixel to which Second Method is Applied]

Next, a top surface layout of the pixel 21 to which the second method is applied will be described.

FIG. 7 is a top surface layout diagram of the pixel 21 to which the second method is applied.

FIG. 7A is a cross-sectional view of the pixel 21 that is similar to FIG. 3. FIG. 7B is a top surface layout diagram of the pixel 21. Specifically, a cross-sectional view taken along the line a-a' of the top surface layout diagram of the pixel 21 of FIG. 7B is illustrated in FIG. A.

In FIG. 7B, portions of the transmission transistor 32, the memory unit 33, and the read transistor 34 that are positioned at the lower side of the light shielding metal 85 are shown by a dotted line. This is because the light shielding metal 85 is formed to cover the portions of the transmission transistor 32, the memory unit 33, and the read transistor 34 shown by the dotted line, from the upper side.

Portions of the transmission transistor 32, the memory unit 33, and the read transistor 34 that are drawn without being covered by the light shielding metal 85 are shown by a solid line. In the portions of the transmission transistor 32, the memory unit 33, and the read transistor 34 that are drawn without being covered by the light shielding metal 85, contact portions 88-1 to 88-3 are provided to control a gate voltage. A contact portion 88-4 is connected to the FD 35.

As such, in the pixel 21 to which the second method is applied, portions of the gate electrodes 71 to 73 (in FIG. 7B, portions protruding from a hatched light shielding region to the outside) are drawn from the light shielding region covered with the light shielding metal 85 and the contact portions 88-1 to 88-3 are arranged in the portions.

However, in the pixel 21 to which the second method is applied, a region not provided with the light shielding metal digging portion 85m is generated to draw the portions of the gate electrodes 71 to 73 from the light shielding region. Therefore, light may leak from the region not provided with the light shielding metal digging portion 85m, that is, an end 90 (in FIG. 7B, a portion surrounded by a dotted line) of the gate electrode 72 to the memory unit 33. In addition, an area of the pixel 21 may be increased to draw the portions of the gate electrodes 71 to 73 from the light shielding region.

For this reason, a third method of processing the light shielding metal 85 and forming the contact portion 88 on the gate electrode to suppress the leakage of the light from the end of the gate electrode 72 to the memory unit 33 and the increase in the area of the pixel 21 is known. The third method will be described with reference to FIG. 8.

[Top Surface Layout of Pixel to which Third Method is Applied]

FIG. 8 is a cross-sectional view and a top surface layout diagram of the pixel 21 to which the third method is applied.

FIG. 8A is a cross-sectional view taken along the line a-a' of the top surface layout diagram of the pixel 21 of FIG. 8B.

As illustrated in FIG. 8A, a hole that is formed to penetrate the interlayer insulating film 86, the light shielding metal 85 on the gate electrode 71, and the liner film 84 is formed as a processing portion 101-1. A contact portion 88-11 is inserted into the processing portion 101-1 and the gate electrode 71 is connected to a wiring line not illustrated in the drawings.

Likewise, a hole that is formed to penetrate the interlayer insulating film 86, the light shielding metal 85 on the gate electrode 72, and the liner film 84 is formed as a processing portion 101-2. A contact portion 88-12 is inserted into the processing portion 101-2 and the gate electrode 72 is connected to a wiring line not illustrated in the drawings.

FIG. 8B is a top surface layout diagram of the pixel 21.

As illustrated in FIG. 8B, in the pixel 21 to which the third method is applied, the gate electrode 72 is formed to be covered with the light shielding metal 85, without being drawn from the light shielding region as in the second method. Because the contact portion 88-12 is formed on an upper portion of the gate electrode 72, the light shielding metal digging portion 85m is formed in the end of the gate electrode 72. Therefore, the leakage of the light from the end of the gate electrode 72 to the memory unit 33 can be suppressed. Because the gate electrodes 71 and 72 are not drawn from the light shielding region, the area of the pixel 21 can be suppressed from increasing.

As such, the first to third methods are known as the method of suppressing the leakage of the light to the memory unit 33 of the pixel 21.

However, if the first method is applied, the smear may be generated due to the leakage of the light from the side of the PD 31 of the pixel 21 and the image quality may be deteriorated.

If the second method is applied, the leakage of the light from the side of the PD 31 can be suppressed. However, it is necessary to perform transmission of charges from the PD 31 to the gate electrode 72 of the memory unit 33 at a deep position of the semiconductor substrate 41, which results in causing transmission deterioration or formation of a residual image.

If the third method is applied, the leakage of the light from the end of the gate electrode 72 to the memory unit 33 can be suppressed. However, the smear may be generated due to the leakage of the light from the processing portion 101-2 and the image quality may be deteriorated.

For this reason, the inventors have developed a method according to an embodiment of the present disclosure described below to realize both suppression of smear and an excellent transmission characteristic.

Hereinafter, ten embodiments (hereinafter, referred to as first to tenth embodiments) of an image pickup device to which the method according to the embodiment of the present disclosure is applied will be described in the following order.

1. First Embodiment (Example of Digging-Type Light Shielding Metal)
2. Second Embodiment (Example of Digging-Type Gate Electrode)
3. Third Embodiment (Another Example of Digging-Type Light Shielding Metal)
4. Fourth Embodiment (Another Example of Digging-Type Gate Electrode)
5. Fifth Embodiment (Combination Example of First Embodiment and Second Embodiment)
6. Sixth Embodiment (Another Example of Digging-Type Light Shielding Metal)
7. Seventh Embodiment (Another Example of Digging-Type Gate Electrode)
8. Eighth Embodiment (Another Example of Digging-Type Light Shielding Metal)
9. Ninth Embodiment (Another Example of Digging-Type Gate Electrode)
10. Tenth Embodiment (Example Considering Overflow Gate)

1. First Embodiment

Configuration Example of Pixel According to First Embodiment

Figure 9:
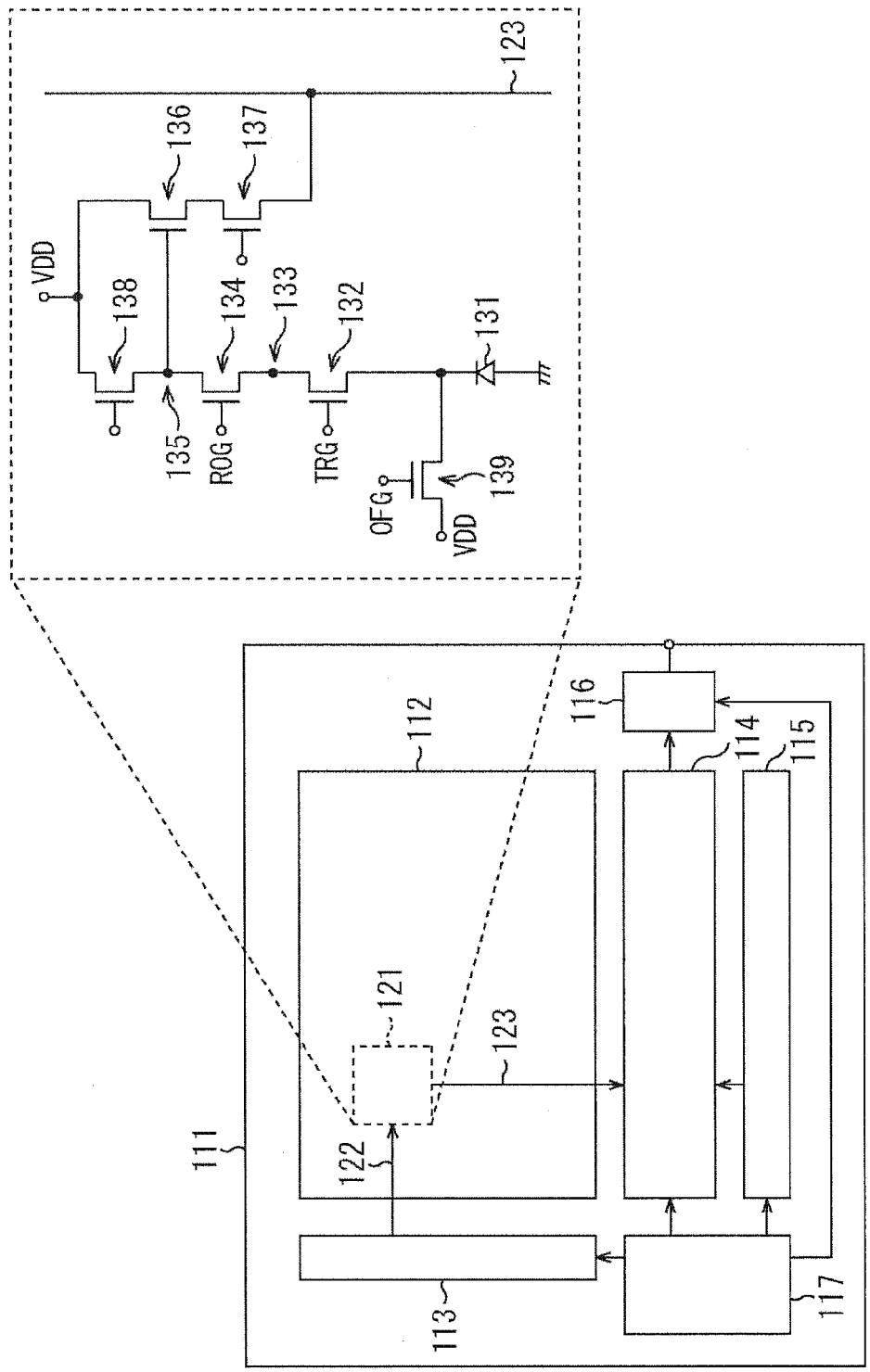
FIG. 9 is a block diagram illustrating a configuration example of an image pickup device according to a first embodiment to which the present disclosure is applied.

FIG. 9 is a block diagram illustrating a configuration example of an image pickup device 111 according to a first embodiment to which the present disclosure is applied.

The image pickup device 111 is configured as a CMOS image sensor and includes a pixel array unit 112, a vertical driving unit 113, a column processing unit 114, a horizontal driving unit 115, an output unit 116, and a driving control unit 117.

The pixel array unit 112 is configured by arranging a plurality of pixels 121 regularly in an array shape. The pixel array unit 112 is connected to the vertical driving unit 113 by a horizontal signal line 122 for each row of a group of the pixels 121. In addition, the pixel array unit 112 is connected to the column processing unit 114 by a vertical signal line 123 for each column of the group of the pixels 121. That is, in the pixel array unit 112, one pixel 121 is arranged at an intersection of the horizontal signal line 122 and the vertical signal line 123.

The pixel 121 includes a PD 131, a transmission transistor 132, a memory unit 133, a read transistor 134, an FD 135, an amplification transistor 136, a selection transistor 137, a first reset transistor 138, and a second reset transistor 139.

The basic configuration of each of the image pickup device 111 to the vertical signal line 123 and the PD 131 to the second reset transistor 139 is the same as the basic configuration of each of the image pickup device 11 to the vertical signal line 23 and the PD 31 to the second reset transistor 39 of FIG. 1. Therefore, explanation of the structural elements having the same configurations is omitted.

[Configuration Example of Pixel According to First Embodiment]

Figure 10:
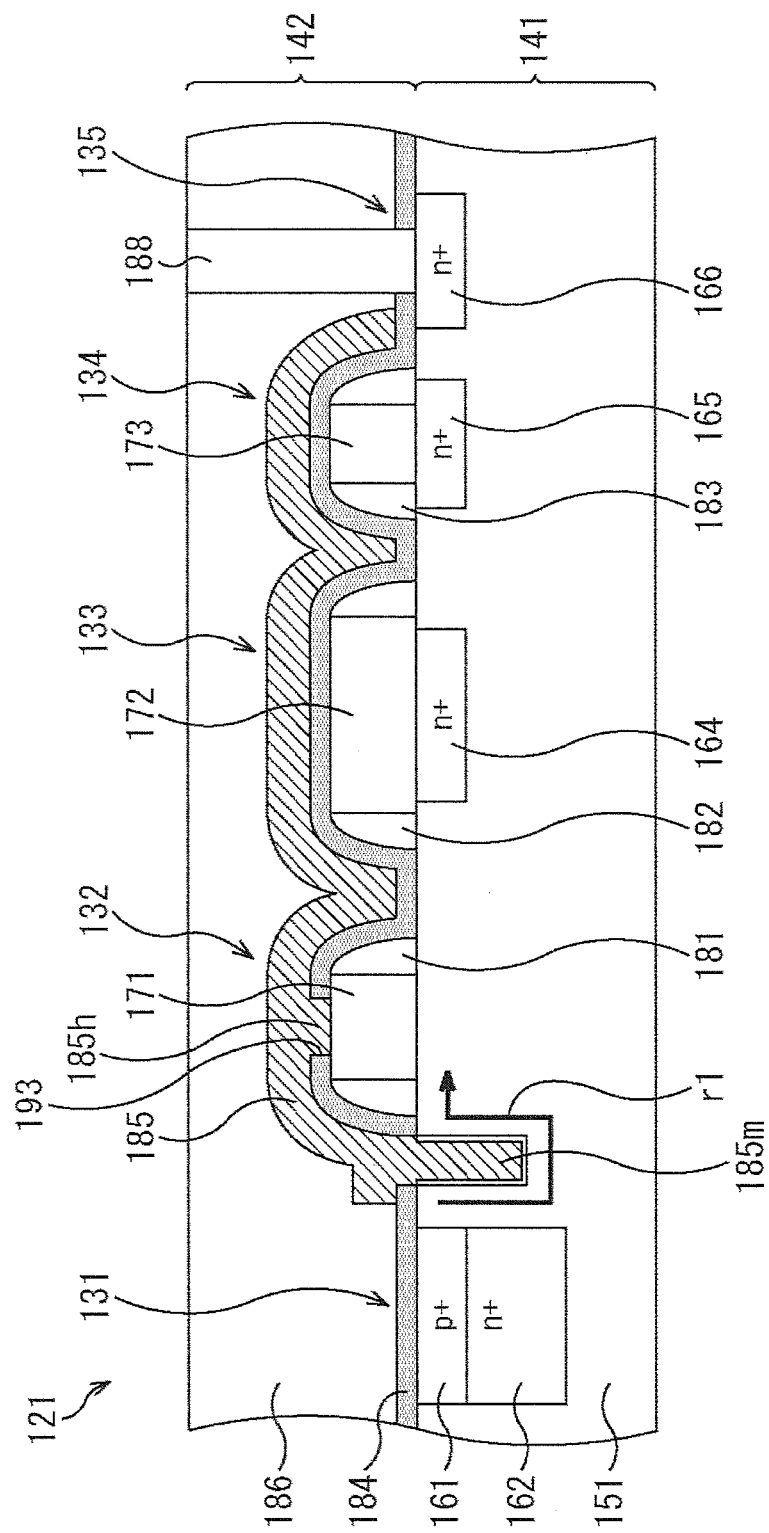
FIG. 10 is a cross-sectional view illustrating a configuration example of a pixel according to the first embodiment to which the present disclosure is applied.

FIG. 10 is a cross-sectional view illustrating a configuration example of the pixel 121 according to the first embodiment to which the present disclosure is applied.

The pixel 121 is configured by stacking a semiconductor substrate 141, a wiring layer 142, and a color filter layer and an on-chip lens layer not illustrated in the drawings. In FIG. 10, a wiring line, the color filter layer, and the on-chip lens layer that are included in the wiring layer 142 are not illustrated.

In the semiconductor substrate 141, a P-type region 161 and an N-type region 162 of the PD 131, an N-type region 164 of the memory unit 133, an N-type region 165 of the read transistor 134, and an N-type region 166 of the FD 135 are formed in a P-type silicon layer 151.

In the wiring layer 142, a gate electrode 171 of the transmission transistor 132, a gate electrode 172 of the memory unit 133, and a gate electrode 173 of the read transistor 134 are formed through a gate insulating film (not illustrated in the drawings) formed on a surface of the semiconductor substrate 141. The gate electrode 171 is formed of polysilicon and is stacked on the semiconductor substrate 141. The gate electrode 172 is formed of polysilicon and is stacked on a portion of the semiconductor substrate 141 in which the N-type region 164 is formed. The gate electrode 173 is formed of polysilicon and is stacked on a portion of the semiconductor substrate 141 in which the N-type region 165 is formed.

In the wiring layer 142, sidewalls 181 to 183 are formed to surround sides of the gate electrodes 171 to 173. A liner film 184 is formed to cover the semiconductor substrate 141, the gate electrodes 171 to 173, and the sidewalls 181 to 183. In the wiring layer 142, a light shielding metal 185 is formed to cover an entire region of the transmission transistor 132, the memory unit 133, and the read transistor 134, through the liner film 184. An interlayer insulating film 186 is formed to be stacked on the light shielding metal 185. In the interlayer insulating film 186, a wiring line not illustrated in the drawings and a contact portion 188 are formed. The contact portion 188 is formed to connect the wiring line not illustrated in the drawings and the N-type region 166.

As illustrated in FIG. 10, in the pixel 121, the light shielding metal 185 is formed to cover an entire region of the transmission transistor 132, the memory unit 133, and the read transistor 134. A portion of the light shielding metal 185 is configured to dig into a groove formed in the semiconductor substrate 141. That is, the portion having the above configuration in the light shielding metal 185 corresponds to a light shielding metal digging portion 185m. As such, in the pixel 121, because the light shielding metal 185 is configured to have the light shielding metal digging portion 185m, leakage of light from the side of the PD 131 can be suppressed.

In the pixel 121, a hole 193 is formed in the liner film 184 and the digging-type light shielding metal 185 and the gate electrode 171 of the transmission transistor 132 are connected by a light shielding metal connecting portion 185h inserted into the hole 193. Thereby, a channel for transmission is formed in the light shielding metal digging portion 185m and voltage control is enabled.

In the pixel 121, a transmission path r1 from the PD 131 to the gate electrode 172 of the memory unit 133 is shown by an arrow. Because the channel for the transmission is formed in the light shielding metal digging portion 185m, the transmission path r1 becomes a path that passes a surrounding portion of the light shielding metal digging portion 185m.

In the pixel 121, because the digging-type light shielding metal 185 is configured to have the light shielding metal digging portion 185m, the transmission path r1 is arranged at a deep position of the semiconductor substrate 141. However, in the pixel 121, the light shielding metal digging portion 185m has the same potential as the gate electrode 171 by the light shielding metal connecting portion 185h and the channel for the transmission is formed in the light shielding metal digging portion 185m. Therefore, transmission of charges from the PD 131 to the gate electrode 172 of the memory unit 133 is performed securely along the transmission path r1.

As such, in the pixel 121 according to the first embodiment, because the leakage of the light to the memory unit 133 is prevented by the digging-type light shielding metal 185, the smear can be suppressed. In the pixel 121, the digging-type light shielding metal 185 and the gate electrode 171 are connected by the light shielding metal connecting portion 185h, so that the channel for the transmission is formed in the light shielding metal digging portion 185m. Therefore, the pixel 121 can have an excellent transmission characteristic.

[Method of Manufacturing Image Pickup Device]

Figure 11:
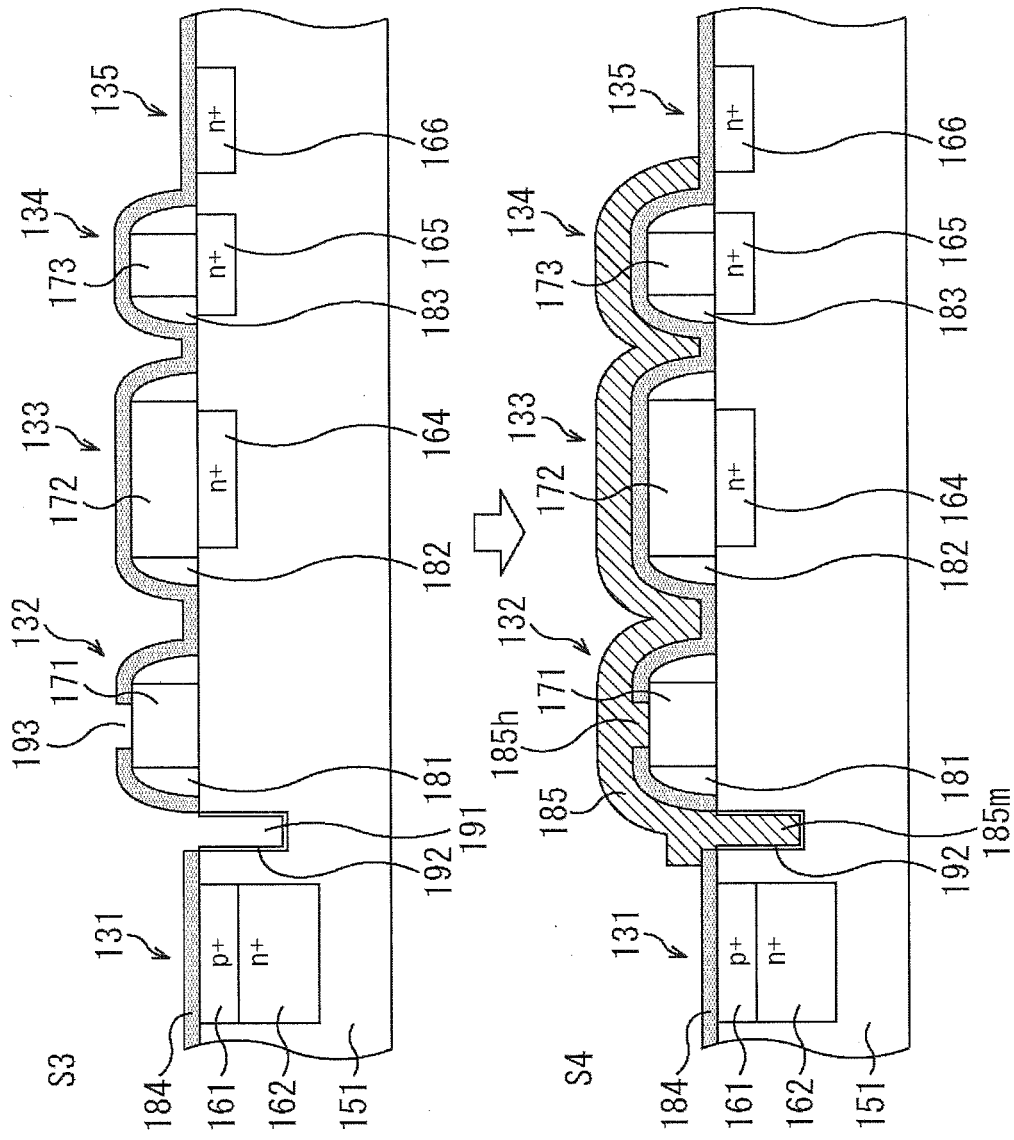
FIG. 11 is a diagram illustrating a method of manufacturing an image pickup device.

Next, a method of manufacturing the image pickup device 111 having the pixels 121 will be described with reference to FIG. 11.

First, the basically same processing as steps S1P and S2P of FIG. 4 is executed.

That is, similar to the processing of step S1P, the manufacturing apparatus executes the lithography and the ion implantation on the silicon layer 151 becoming the semiconductor substrate 141 and forms the P-type region 161, the N-type region 162, and the N-type regions 164 to 166 in desired places.

Similar to the processing of step S2P, the manufacturing apparatus forms the gate electrodes 171 to 173 and the sidewalls 181 to 183.

That is, the manufacturing apparatus forms a polysilicon film on an entire surface, after forming a gate insulating film not illustrated in the drawings. The manufacturing apparatus executes the lithography and the dry etching and leaves portions becoming the gate electrodes 171 to 173 and removes polysilicon of unnecessary portions. Thereby, patterns that become the gate electrodes 171 to 173 are formed. Then, the manufacturing apparatus forms the sidewalls 181 to 183. As a formation material of the sidewalls 181 to 183, single layers of insulating films such as an oxide film and a nitride film or a combination thereof can be adopted.

Instead of the processing of steps S3P and S4P of FIG. 5, processing of next steps S3 and S4 is executed.

In step S3, the manufacturing apparatus forms the liner film 184 on an entire surface.

The liner film 184 is formed using a chemical vapor deposition (CVD) method. For example, a nitride film that has a film thickness of 50 nm is used. After forming the liner film 184, the manufacturing apparatus performs patterning on a desired place of the side of the PD 131, performs etching, and forms the groove 191 in the semiconductor substrate 141. At this time, reactive ion etching (RIE) using gas of a Cl system, a CF system, and an HBr system is performed and the groove 191 having the depth of 500 nm is formed.

Then, in order to form the light shielding metal digging portion 185m, the manufacturing apparatus forms a hole in the liner film 184 of a formation position of the light shielding metal digging portion 185m and forms the groove 191 in the semiconductor substrate 141 of a lower position of the hole. The manufacturing apparatus forms an oxide film 192 on a surface of the groove 191 to insulate the light shielding metal 185 and a portion of the semiconductor substrate 141 corresponding to the groove 191 from each other. When the oxide film 192 is formed, oxidation using a diffusion furnace, rapid thermal oxidation (RTO), and film formation (oxidation film and nitride film) using the CVD method can be applied. In order to suppress substrate damage at the time of processing the semiconductor substrate 141, the manufacturing apparatus may perform P-type implantation on a peripheral portion of the groove 191, for example, implant boron into the peripheral portion, before and after forming the oxide film 192.

Then, the manufacturing apparatus executes patterning on the liner film 184 to connect the digging-type light shielding metal 185 and the gate electrode 171, forms the hole 193, and exposes the gate electrode 171.

In step S4, the manufacturing apparatus forms the light shielding metal 185. At this time, the light shielding metal 185 is implanted into the groove 191 formed by the processing of step S3. Thereby, the digging-type light shielding metal 185 that has the light shielding metal digging portion 185m is formed.

The manufacturing apparatus forms a tungsten film having a film thickness of 150 nm, using a sputtering method, the CVD method, an atomic layer deposition (ALD) method, or a combination thereof. Then, the tungsten film of the unnecessary portion is removed by the lithography and the dry etching and a pattern of the desired light shielding metal 185 is formed.

A film kind and a film thickness of the light shielding metal 185 are not limited as long as a requested light shielding property is satisfied. As the film kind of the light shielding metal 185, in addition to the tungsten film, a single film of titanium, tantalum, aluminum, hafnium, and copper, a nitride film, an oxidation film, or a carbonization film thereof, or a combination thereof can be adopted. The film thickness of the light shielding metal 185 is preferably about 50 to 300 nm.

Under the light shielding metal 185, a barrier metal may be formed. For example, titanium, tantalum, and tungsten, a nitride system and a carbide system thereof, or a combination thereof can be adopted. If the barrier metal is formed, effects of improving adhesion, improving a barrier property, improving a light shielding property based on grain control, and improving electron migration resistance are expected.

The light shielding metal 185 is implanted into the hole 193 formed in step S3, so that the light shielding metal connecting portion 185h is formed and the digging-type light shielding metal 185 and the gate electrode 171 are connected.

Then, the same processing as steps S5P and S6P of FIG. 6 is executed. That is, the interlayer insulating film 186 is formed and is flattened by the CMP. Then, the contact portion 188, the necessary wiring line, the color filter layer, and the on-chip lens layer are formed.

By the processing of steps described above, the image pickup device 111 that can realize both suppression of smear and an excellent transmission characteristic in the CMOS image sensor in which the memory unit is provided for each pixel and the global shutter imaging is enabled can be manufactured.

2. Second Embodiment

Configuration Example of Pixel According to Second Embodiment

Next, a pixel 121 according to a second embodiment will be described with reference to FIGS. 12 to 15.

Figure 12:
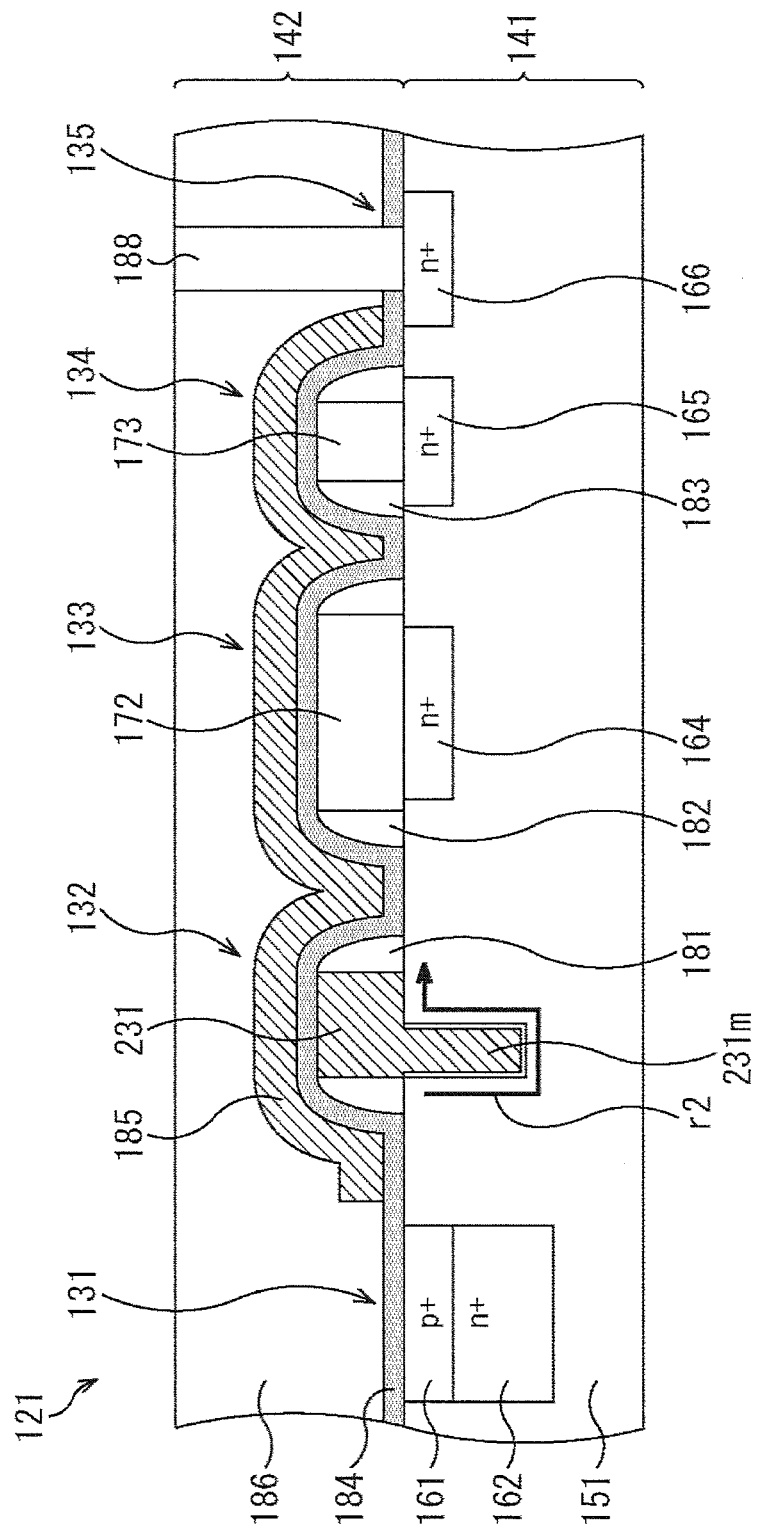
FIG. 12 is a cross-sectional view illustrating a configuration example of a pixel according to a second embodiment.

FIG. 12 is a cross-sectional view illustrating a configuration example of the pixel 121 according to the second embodiment. In FIG. 12, structural elements that are common to the structural elements of the pixel 121 of FIG. 10 are denoted with the same reference numerals and detailed explanation thereof is omitted.

As illustrated in FIG. 12, in the pixel 121, a light shielding metal 185 is formed to cover an entire region of a transmission transistor 132, a memory unit 133, and a read transistor 134. In the pixel 121, the light shielding metal 185 does not have a digging-type structure, different from the first embodiment. Instead, in the pixel 121, a portion of a gate electrode 231 of the transmission transistor 132 is configured to dig into a semiconductor substrate 141. Therefore, the portion having the above configuration in the gate electrode 231 is hereinafter referred to as a gate electrode digging portion 231m. As a formation material of the gate electrode 231 having the gate electrode digging portion 231m, an electrode material having a light shielding characteristic is adopted.

In the pixel 121 having the above configuration, a voltage of the digging-type gate electrode 231 having the light shielding characteristic is controlled and a channel for transmission is formed at a deep position of the semiconductor substrate 141. Thereby, transmission of charges from a PD 131 to a gate electrode 172 of the memory unit 133 is performed securely along a transmission path r2.

In the pixel 121, the transmission path r2 from the PD 131 to the gate electrode 172 of the memory unit 133 is shown by an arrow. Because the channel for the transmission is formed in the gate electrode digging portion 231m, the transmission path r2 becomes a path that passes a surrounding portion of the gate electrode digging portion 231m.

As such, in the pixel 121 according to the second embodiment, because leakage of light to the memory unit 133 is prevented by the digging-type gate electrode 231 having the light shielding characteristic, smear can be suppressed. In the pixel 121, the voltage of the digging-type gate electrode 231 is controlled and the channel for the transmission is formed at the deep position of the semiconductor substrate 141. Therefore, the pixel 121 can have an excellent transmission characteristic.

If at least a portion of the digging-type gate electrode 231 embedded in the semiconductor substrate 141, that is, the gate electrode digging portion 231m is formed of an electrode material having a light shielding characteristic, the smear can be suppressed. However, the other portion of the digging-type gate electrode 231 other than the gate electrode digging portion 231m may be formed of the electrode material having the light shielding characteristic. In this case, because the light shielding metal 185 right above the digging-type gate electrode 231 is not a necessarily used structural element, a degree of freedom can be applied to a layout of the light shielding metal 185 of the pixel 121.

For the purpose of the standardization of the structure in the pixel 121, the gate electrode 172 of the memory unit 133 and the gate electrode 173 of the read transistor 134 may be formed of the electrode material having the light shielding characteristic, similar to the digging-type gate electrode 231.

[Method of Manufacturing Image Pickup Device]

Next, a method of manufacturing an image pickup device 111 having the pixels 121 will be described with reference to FIG. 13.

First, in step S21, the manufacturing apparatus forms a P-type region 161, an N-type region 162, and N-type regions 164 to 166 on a silicon layer 151. That is, the manufacturing apparatus executes lithography and ion implantation on the silicon layer 151 becoming the semiconductor substrate 141 and forms the P-type region 161, the N-type region 162, and the N-type regions 164 to 166 in desired places.

The manufacturing apparatus forms a groove 241 in the semiconductor substrate 141 of the formation position of the gate electrode digging portion 231m to form the gate electrode digging portion 231m. At this time, RIE using gas of a Cl system, a CF system, and an HBr system is performed and the groove 241 having the depth of 500 nm is formed.

Then, the manufacturing apparatus forms a gate insulating film 242 on a surface of the groove 241. An ion may be implanted into a peripheral portion of the groove 241 to adjust a threshold potential Vth (that is, a threshold voltage Vth) of the gate electrode 231.

In step S22, the manufacturing apparatus forms a gate electrode 172 and a gate electrode 173.

That is, the manufacturing apparatus forms a polysilicon film on an entire surface. The manufacturing apparatus executes the lithography and the dry etching and leaves portions becoming the gate electrodes 172 and 173 and removes polysilicon of unnecessary portions. Thereby, patterns that become the gate electrodes 172 and 173 are formed.

In step S23, the manufacturing apparatus forms the digging-type gate electrode 231 having the light shielding characteristic. At this time, the manufacturing apparatus implants a part of the digging-type gate electrode 231 into the groove 241 formed in step S21 and forms the gate electrode digging portion 231m.

As a formation material of the digging-type gate electrode 231, a single film of tungsten, titanium, tantalum, aluminum, hafnium, and copper, a nitride film, an oxidation film, or a carbonization film thereof, or a combination thereof that is a material having a light shielding property can be adopted. Because selectivity with Si of the semiconductor substrate 141 can be kept, only the portion of the digging-type gate electrode 231 can be selectively processed. The digging-type gate electrode 231 may be formed before and after the gate electrodes 172 and 173 are formed. As described above, for the purpose of the standardization of the structure in the pixel 121, the gate electrodes 172 and 173 may be formed of the electrode material having the light shielding characteristic, similar to the digging-type gate electrode 231.

Then, the basically same processing as steps S2P to S6P of FIGS. 4 to 6 is executed. However, in the pixel 121 according to the second embodiment, the light shielding metal 185 is not formed to have the digging-type structure. That is, the sidewalls 181 to 183, the liner film 184, and the light shielding metal 185 are formed. The interlayer insulating film 186 is formed and is flattened by the CMP. Then, the contact portion 188, the necessary wiring line, the color filter layer, and the on-chip lens layer are formed.

By the processing of steps described above, the image pickup device 111 that can realize both suppression of smear and an excellent transmission characteristic in the CMOS image sensor in which the memory unit is provided for each pixel and the global shutter imaging is enabled can be manufactured.

[Another Method of Manufacturing Image Pickup Device]

Figure 14:
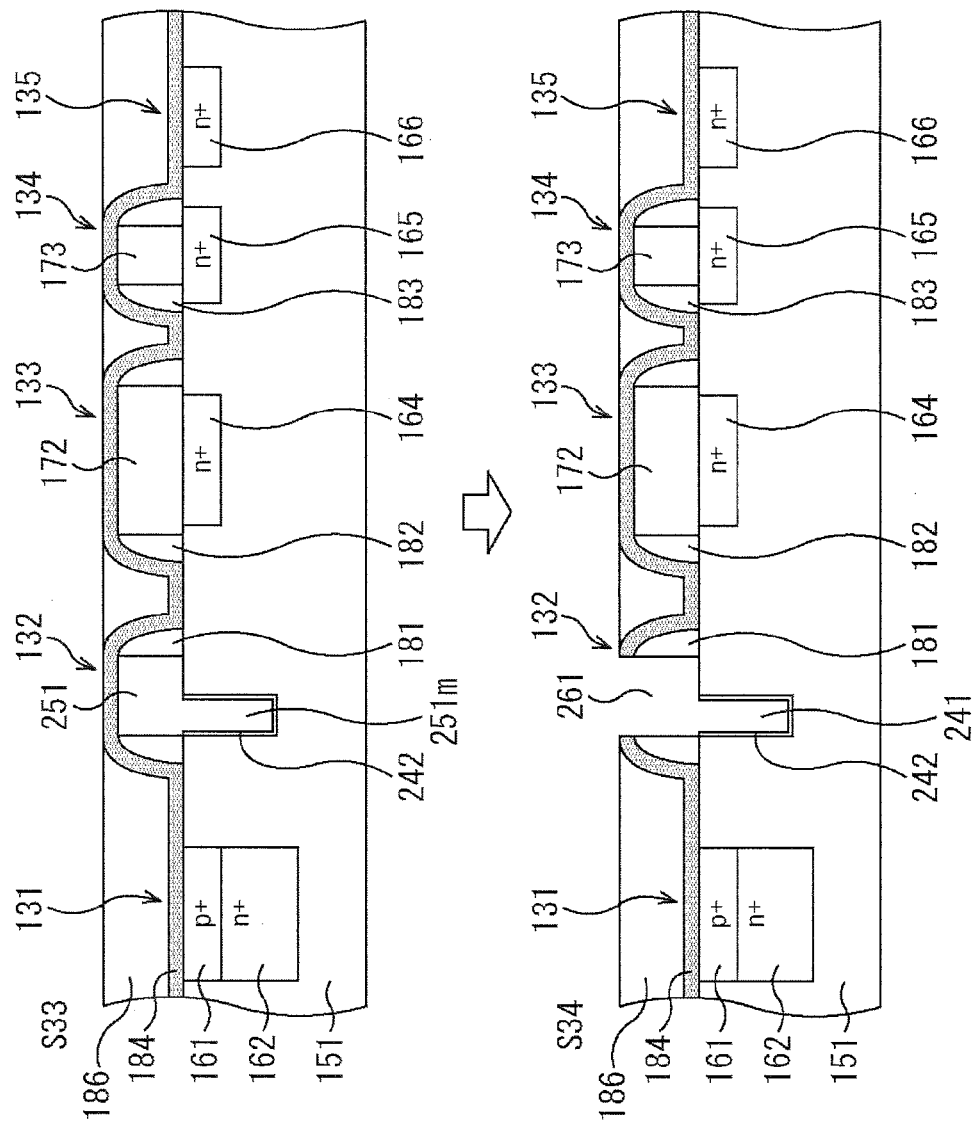
FIG. 14 is a diagram illustrating another method of manufacturing an image pickup device.

Next, another method of manufacturing the image pickup device 111 having the pixels 121 will be described with reference to FIGS. 14 and 15.

Figure 13:
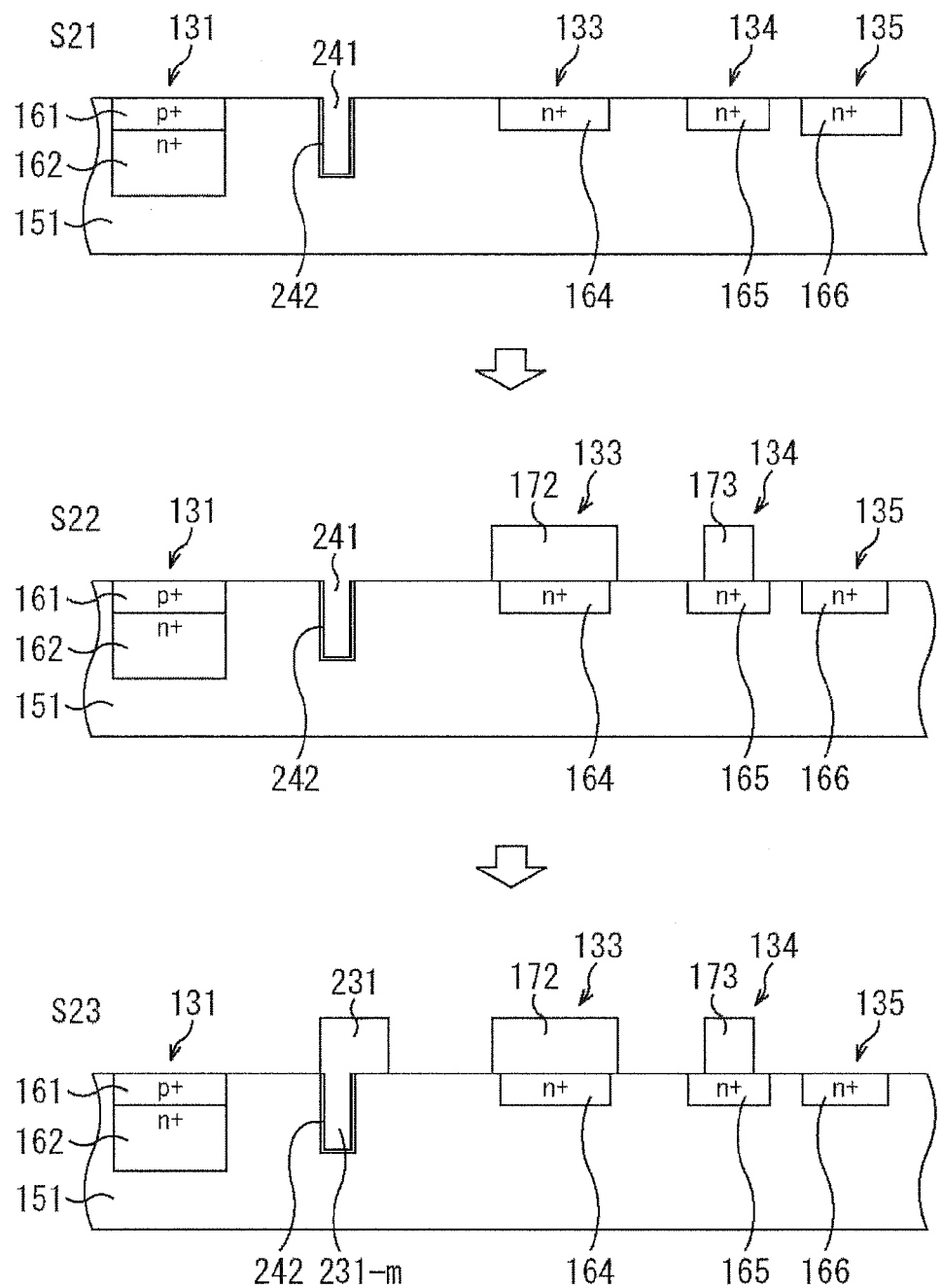
FIG. 13 is a diagram illustrating a method of manufacturing an image pickup device.

First, the same processing as steps S21 and S22 of FIG. 13 is executed. That is, the P-type region 161, the N-type region 162, the N-type regions 164 to 166, the groove 241, the gate insulating film 242, the gate electrode 172, and the gate electrode 173 are formed on the silicon layer 151. Instead of the processing of step S23 of FIG. 13, processing of a next step S33 is executed.

In step S33, the manufacturing apparatus forms the digging-type gate electrode 251 using the same polysilicon as the gate electrodes 172 and 173. That is, a portion of the gate electrode 251 is implanted into the groove 241 formed before the processing of step S33, so that a gate electrode digging portion 251m is formed. Then, the manufacturing apparatus forms the sidewalls 181 to 183, the liner film 184, and the interlayer insulating film 186 and performs flattening until the liner film 184 is exposed by the CMP. At this time, a condition of keeping a selection ratio with the liner film 184 is preferably applied to the CMP.

In step S34, the manufacturing apparatus performs patterning with a resist to open a portion of the gate electrode 251 and removes the digging-type gate electrode 251 and the liner film 184 of an upper portion of the digging-type gate electrode 251 from the semiconductor substrate 141. As a result, an opening 261 that has a shape equivalent to a shape of the cut digging-type gate electrode 251 is formed. In the opening 261, the groove 241 that has a shape equivalent to a shape of the cut gate electrode digging portion 251m of the gate electrode 251 is formed. At this time, the manufacturing apparatus forms the opening 261 to keep a selection ratio with the gate insulating film 242 formed on the surface of the groove 241. Alternatively, the manufacturing apparatus may newly form the gate insulating film 242, after removing the gate insulating film 242 formed on the surface of the groove 241.

Figure 15:
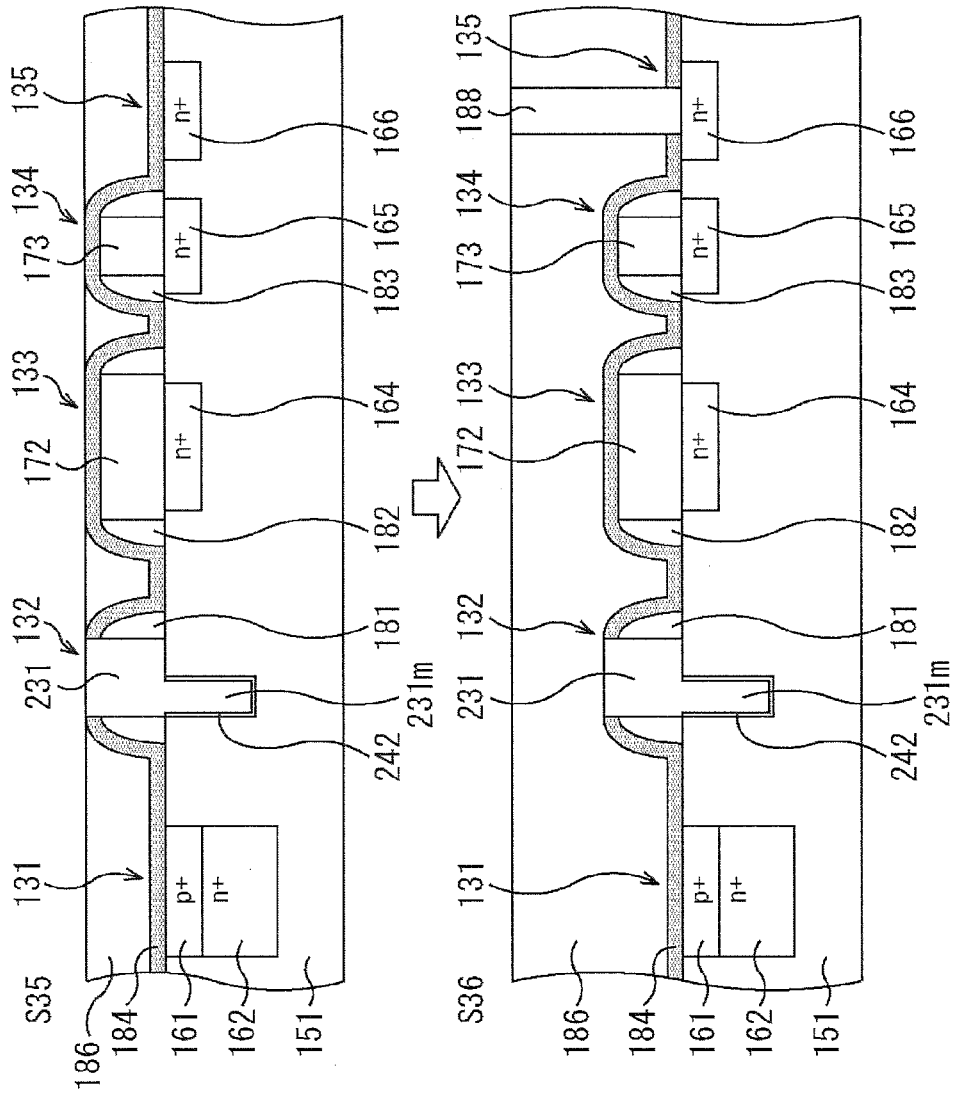
FIG. 15 is a diagram illustrating another method of manufacturing an image pickup device.

Next, as illustrated in FIG. 15, in step S35, the manufacturing apparatus forms the digging-type gate electrode 231 that has a light shielding characteristic. At this time, the manufacturing apparatus implants an electrode material having the light shielding characteristic into the opening 261 formed in step S34 and forms the digging-type gate electrode 231. In this case, the electrode material that is implanted into the groove 241 and has the light shielding characteristic forms the gate electrode digging portion 231m. Then, the manufacturing apparatus removes the unnecessary portions of the digging-type gate electrode 231 implanted into the opening 261, by the CMP.

In step S36, the manufacturing apparatus increases the interlayer insulating film 186 and forms the contact portion 188. Then, the manufacturing apparatus forms the color filter layer and the on-chip lens layer, after forming the necessary wiring line.

By the processing of steps described above, the image pickup device 111 that can realize both suppression of smear and an excellent transmission characteristic in the CMOS image sensor in which the memory unit is provided for each pixel and the global shutter imaging is enabled can be manufactured.

In the pixel 121, a hole may be formed in the liner film 184 and the light shielding metal 185 and the digging-type gate electrode 231 having the light shielding characteristic may be connected by the light shielding metal connecting portion 185h (refer to the first embodiment) inserted into the hole.

3. Third Embodiment

Configuration Example of Pixel According to Third Embodiment

Next, a pixel 121 according to a third embodiment will be described with reference to FIG. 16.

Figure 16:
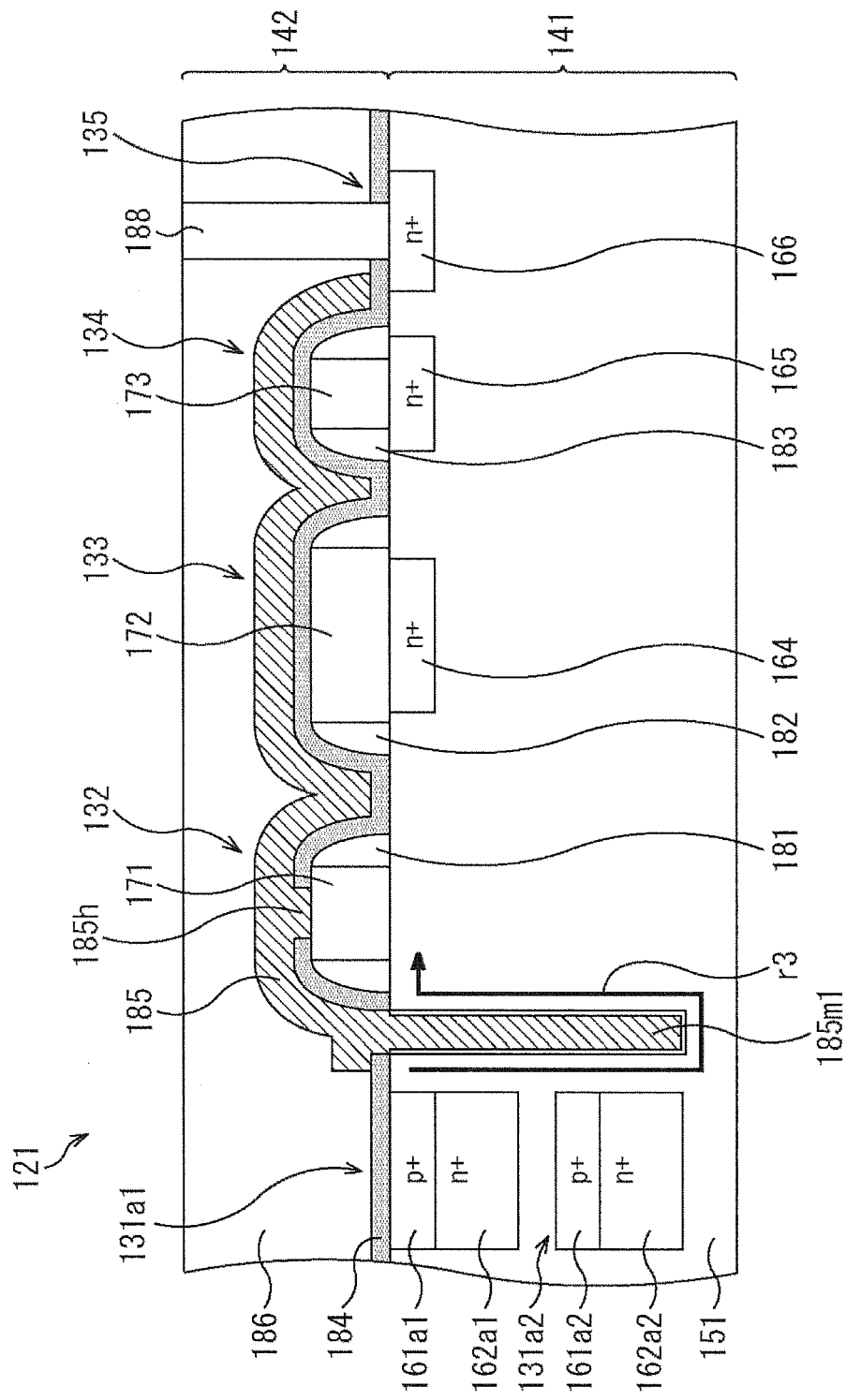
FIG. 16 is a cross-sectional view illustrating a configuration example of a pixel according to a third embodiment.

FIG. 16 is a cross-sectional view illustrating a configuration example of the pixel 121 according to the third embodiment. In FIG. 16, structural elements that are common to the structural elements of the pixel 121 of FIG. 10 are denoted with the same reference numerals and detailed explanation thereof is omitted.

As illustrated in FIG. 16, the pixel 121 has the basically same configuration as the pixel according to the first embodiment. That is, in the pixel 121, a light shielding metal 185 has a digging-type structure with a light shielding metal digging portion 185m1. In the pixel 121, the digging-type light shielding metal 185 and a gate electrode 171 of a transmission transistor 132 are connected by a light shielding metal connecting portion 185h.

In this case, a shape of the light shielding metal digging portion 185m1 of the digging-type light shielding metal 185 is not limited to the example of the first embodiment in particular and may be arbitrarily set. For this reason, in the third embodiment, the length (depth) of the light shielding metal digging portion 185m1 of the digging-type light shielding metal 185 in a longitudinal direction is longer than the length in the first embodiment. As a result, the light shielding metal digging portion 185m1 further digs into a semiconductor substrate 141. Specifically, in the first embodiment, the depth of the light shielding metal digging portion 185m is only 500 nm. However, in this embodiment, the depth of the light shielding metal digging portion 185m1 becomes 2 μm.

As a result, in the pixel 121, a plurality of steps of PDs 131 may be stacked in a depth direction of the semiconductor substrate 141. Specifically, in the example of FIG. 16, in the semiconductor substrate 141 of the pixel 121, a P-type region 161a1 and an N-type region 162a1 of a PD 131a1 and a P-type region 161a2 and an N-type region 162a2 of a PD 131a2 are stacked in two steps in the depth direction.

In the pixel 121, a transmission path r3 from the PD 131 to a gate electrode 172 of a memory unit 133 is shown by an arrow. Because the light shielding metal digging portion 185m1 has the same potential as the gate electrode 171 and a channel for transmission is formed in the light shielding metal digging portion 185m1, the transmission path r3 becomes a path that passes a surrounding portion of the light shielding metal digging portion 185m1.

As such, in the pixel 121 according to the third embodiment, the light shielding metal digging portion 185m1 of the digging-type light shielding metal 185 digs into a further deep position of the semiconductor substrate 141, as compared with the first embodiment. As a result, the plurality of steps of PDs 131 can be stacked. As such, even though the plurality of steps of PDs 131 are stacked, transmission of charges from the PD 131 to the gate electrode 172 of the memory unit 133 is performed securely along the transmission path r3. Because the plurality of steps of PDs 131 are stacked and arranged, a saturation charge amount can be increased.

Also, in the pixel 121 according to the second embodiment, the gate electrode digging portion 231m of the digging-type gate electrode 231 digs into the further deep position of the semiconductor substrate 141, so that the plurality of steps of PDs 131 can be stacked. In this case, the same effect as the pixel 121 according to the third embodiment can be obtained.

4. Fourth Embodiment

Configuration Example of Pixel According to Fourth Embodiment

Next, a pixel 121 according to a fourth embodiment will be described with reference to FIG. 17.

Figure 17:
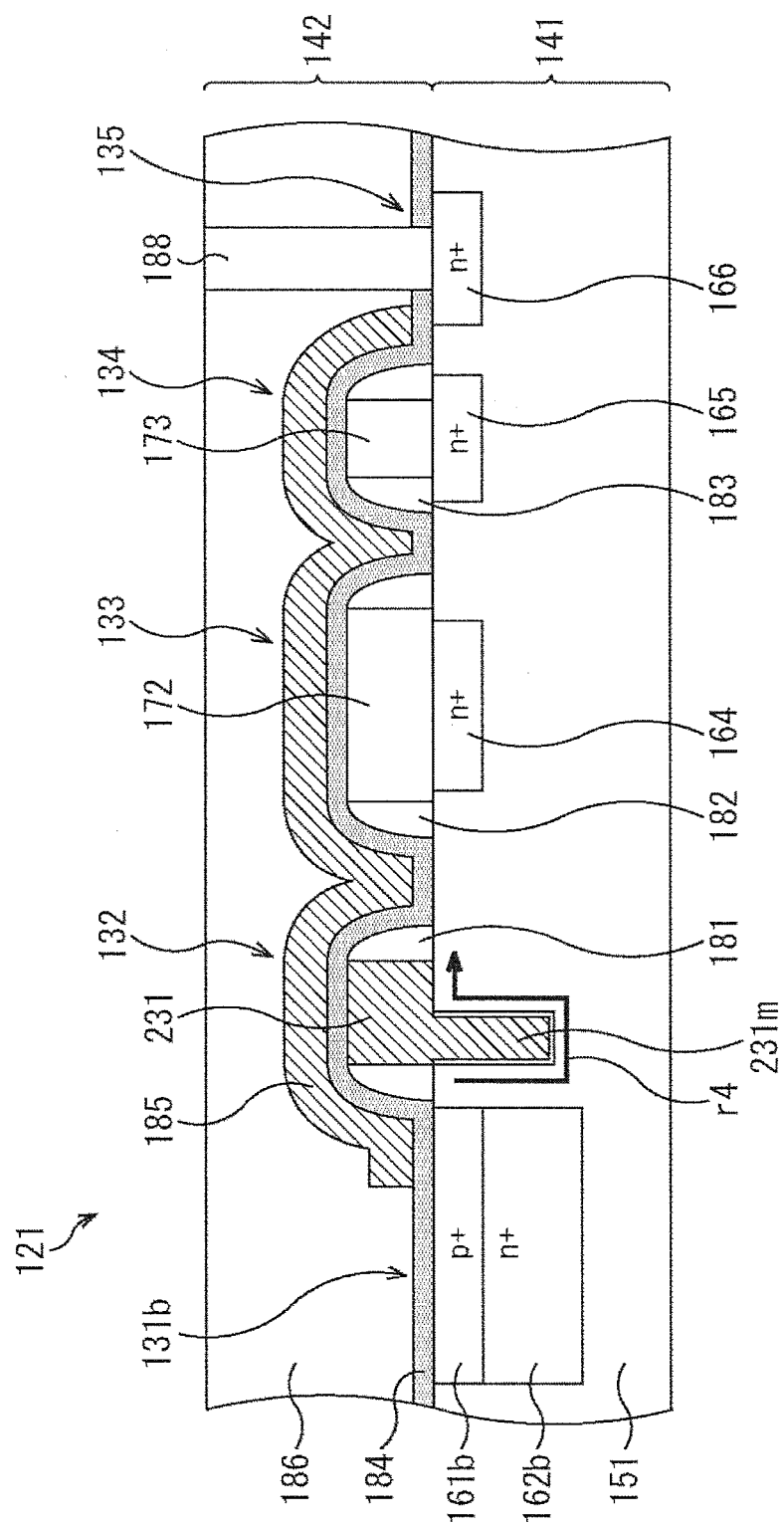
FIG. 17 is a cross-sectional view illustrating a configuration example of a pixel according to a fourth embodiment.

FIG. 17 is a cross-sectional view illustrating a configuration example of the pixel 121 according to the fourth embodiment. In FIG. 17, structural elements that are common to the structural elements of the pixel 121 of FIG. 12 are denoted with the same reference numerals and detailed explanation thereof is omitted.

As illustrated in FIG. 17, the pixel 121 has the basically same configuration as the pixel according to the second embodiment. That is, in the pixel 121, a light shielding metal 185 does not have a digging-type structure and a gate electrode 231 has a digging-type structure with a gate electrode digging portion 231m.

In the pixel 121, a transmission path r4 from a PD 131 to a gate electrode 172 of a memory unit 133 is shown by an arrow. Because a channel for transmission is formed in the gate electrode digging portion 231m, the transmission path r4 becomes a path that passes a surrounding portion of the gate electrode digging portion 231m.

The second embodiment and the fourth embodiment are different from each other in a volume of the PD 131 in a semiconductor substrate 141. In the first and third embodiments, the light shielding metal digging portion 185m digs into the semiconductor substrate 141. Meanwhile, in the second and fourth embodiments, the gate electrode digging portion 231m digs into the semiconductor substrate 141. However, with regard to a distance of a horizontal direction from the PD 131 in the semiconductor substrate 141, the distance in the case of forming the gate electrode digging portion 231m according to the second and fourth embodiments becomes longer than the distance in the case of forming the light shielding metal digging portion 185m according to the first and third embodiments. A shape of the PD 131 can be freely designed by the increased distance. Therefore, in the second embodiment, the PD 131 having the same volume as that of the first or third embodiment is adopted to facilitate a comparison with the first or third embodiment. Meanwhile, in the fourth embodiment, a PD 131b of which a volume has increased is adopted to effectively use the increased distance.

That is, in the fourth embodiment, the PD 131b is expanded to the side of the digging-type gate electrode 231, as compared with the second embodiment. As a result, because a region of the PD 131b is expanded, the saturation charge amount can be increased.

The first to fourth embodiments are sequentially and individually described above as the embodiments of the pixel 121. However, the embodiments are not necessarily used individually and may be combined. Therefore, an embodiment in which the first and second embodiments are combined will be described as a fifth embodiment.

5. Fifth Embodiment

Configuration Example of Pixel According to Fifth Embodiment

Next, a pixel 121 according to the fifth embodiment will be described with reference to FIG. 18.

Figure 18:
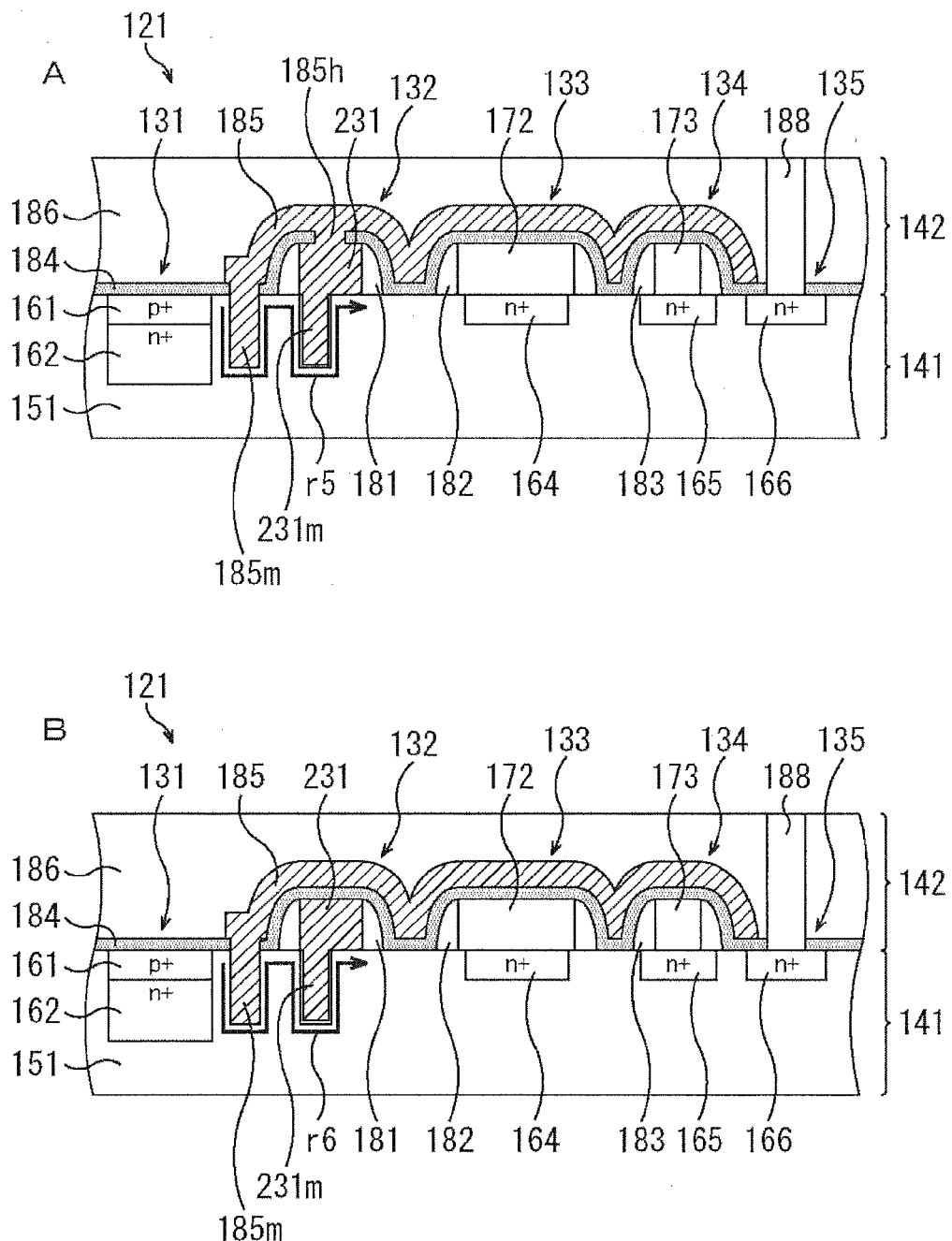
FIG. 18 is a cross-sectional view illustrating a configuration example of a pixel according to a fifth embodiment.

FIG. 18 is a cross-sectional view illustrating a configuration example of the pixel 121 according to the fifth embodiment. In FIG. 18, structural elements that are common to the structural elements of the pixel 121 of FIGS. 10 and 12 are denoted with the same reference numerals and detailed explanation thereof is omitted.

In the pixel 121, a transmission path r5 from a PD 131 to a gate electrode 172 of a memory unit 133 is shown by an arrow. The transmission path r5 becomes a path that passes surrounding portions of a light shielding metal digging portion 185m and a gate electrode digging portion 231m.

As illustrated in FIG. 18A, the pixel 121 has a structure in which the digging-type light shielding metal 185 according to the first embodiment and the digging-type gate electrode 231 according to the second embodiment are combined.

That is, in the pixel 121 of FIG. 18A, the light shielding metal 185 has a digging-type structure with the light shielding metal digging portion 185m, similar to the first embodiment. In the pixel 121, the gate electrode 231 having a light shielding characteristic has a digging-type structure with the gate electrode digging portion 231m, similar to the second embodiment. In the pixel 121, the digging-type light shielding metal 185 and the digging-type gate electrode 231 are connected by a light shielding metal connecting portion 185h.

As such, the pixel 121 illustrated in FIG. 18A has a double digging-type structure in which the light shielding metal digging portion 185m of the light shielding metal 185 and the gate electrode digging portion 231m of the gate electrode 231 dig into a semiconductor substrate 141. As a result, the light shielding ability with respect to the memory unit 133 can be further improved and smear can be further suppressed.

In the pixel 121, the digging-type light shielding metal 185 and the digging-type gate electrode 231 are connected by the light shielding metal connecting portion 185*h*, so that the channel for the transmission is formed in the light shielding metal digging portion 185*m*. A voltage of the digging-type gate electrode 231 is controlled, so that the channel for the transmission is formed in the gate electrode digging portion 231*m*. As a result, even though the pixel 121 has the double digging-type structure, transmission of charges from the PD 131 to the gate electrode 172 of the memory unit 133 is performed securely along the transmission path r5.

As illustrated in FIG. 18B, in the pixel 121, the light shielding metal connecting portion 185*h* is not a necessarily used structural element and the digging-type light shielding metal 185 and the digging-type gate electrode 231 may not be connected by the light shielding metal connecting portion 185*h*. In this case, a contact portion not illustrated in the drawings is formed in the digging-type light shielding metal 185, a voltage is controlled, and the channel for the transmission is formed in the light shielding metal digging portion 185*m*. As a result, even though the pixel 121 has the double digging-type structure, transmission of charges from the PD 131 to the gate electrode 172 of the memory unit 133 is performed securely along a transmission path r6, similar to FIG. 18A.

As such, in the pixel 121 according to the fifth embodiment, both suppression of smear and an excellent transmission characteristic can be realized.

In the first to fifth embodiments described above, the gate electrode 171 of the transmission transistor 132 and the gate electrode 172 of the memory unit 133 have been separated from each other. However, the gate electrode 171 of the transmission transistor 132 and the gate electrode 172 of the memory unit 133 are not necessarily separated from each other and may be integrated with each other. Hereinafter, embodiments in which the gate electrode 171 of the transmission transistor 132 and the gate electrode 172 of the memory unit 133 are integrated with each other will be described as sixth and seventh embodiments.

6. Sixth Embodiment

Configuration Example of Pixel According to Sixth Embodiment

Figure 19:
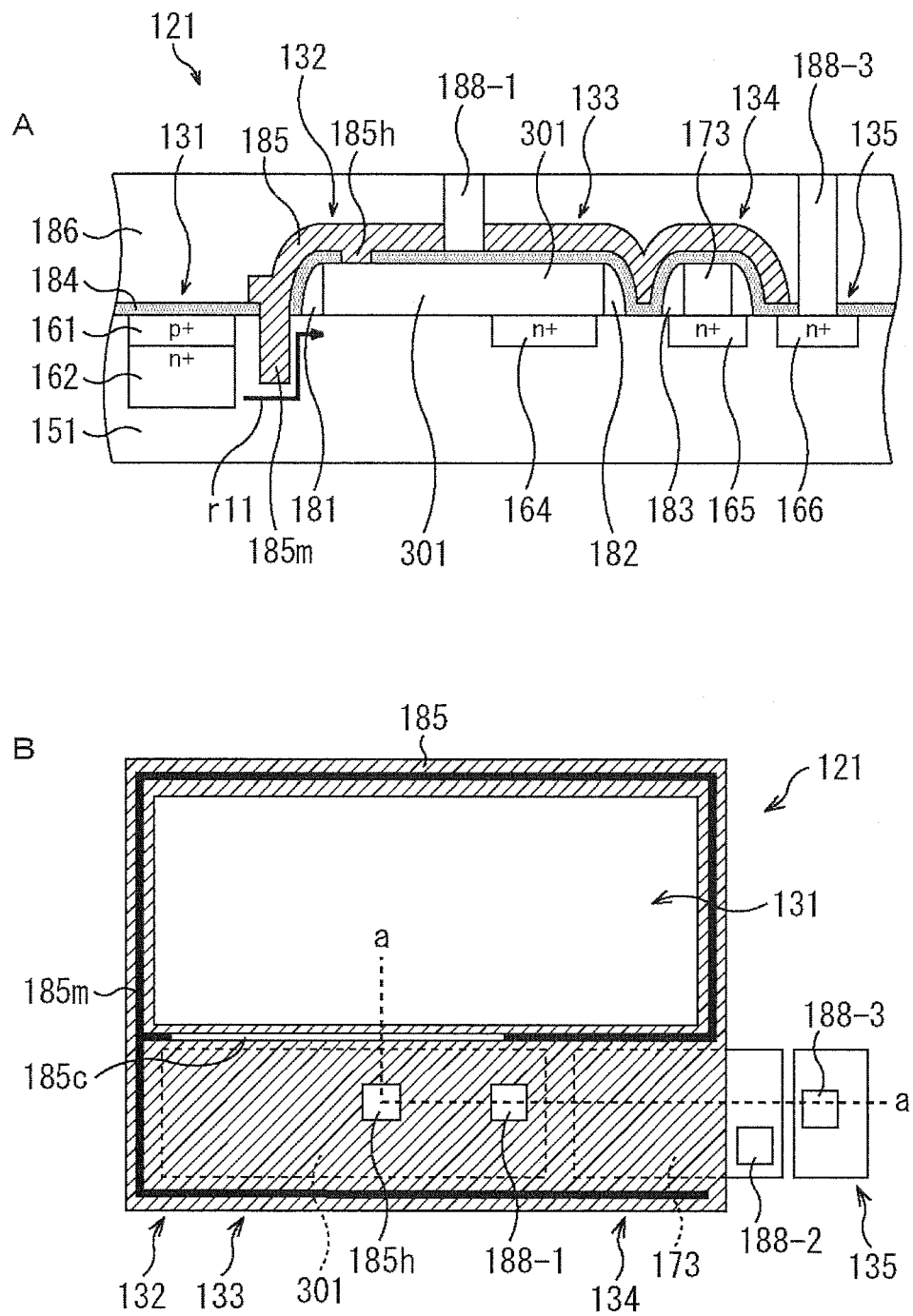
FIG. 19 is a cross-sectional view and a top surface layout diagram of a pixel according to a sixth embodiment.

FIG. 19 is a cross-sectional view and a top surface layout diagram of a pixel 121 according to the sixth embodiment. In FIG. 19, structural elements that are common to the structural elements of the pixel 121 of FIG. 10 are denoted with the same reference numerals and detailed explanation thereof is omitted.

In top surface layout diagrams including FIG. 19, a normal direction of a plane in the top surface layout diagrams becomes a vertical direction. That is, the top surface layout diagram of the pixel 121 illustrates a layout configuration of each structural element in the case in which the pixel 121 is viewed from the upper side.

FIG. 19A is a cross-sectional view taken along the line a-a' of the top surface layout diagram of the pixel 121 of FIG. 19B.

As illustrated in FIG. 19A, in the pixel 121, a gate electrode of a transmission transistor 132 and a gate electrode of a memory unit 133 are integrated with each other and is formed as an integrated gate electrode 301. In the pixel 121, a light shielding metal 185 has a digging-type structure with a light shielding metal digging portion 185*m*. In the pixel 121, the digging-type light shielding metal 185 and the integrated gate electrode 301 are connected by a light shielding metal connecting portion 185*h*.

In the pixel 121, a transmission path r11 from a PD 131 to the integrated gate electrode 301 is shown by an arrow. The transmission path r11 becomes a path that passes a surrounding portion of the light shielding metal digging portion 185*m*.

In the pixel 121, a contact portion 188-1 is formed on the light shielding metal 185. That is, the integrated gate electrode 301 is connected to a wiring line (not illustrated in the drawings) by the contact portion 188-1 formed on the light shielding metal 185 and a voltage thereof is controlled. Because the light shielding metal 185 is connected to the integrated gate electrode 301, a channel for transmission is formed in the light shielding metal digging portion 185*m*. Thereby, transmission of charges from the PD 131 to the integrated gate electrode 301 is performed securely along the transmission path r11.

FIG. 19B is a top surface layout diagram of the pixel 121.

In the pixel 121, the contact portion 188-1 is formed on the integrated gate electrode 301 covered with the light shielding metal 185. A portion of a gate electrode 173 is drawn from a light shielding region and a contact portion 188-2 is formed. A contact portion 188-3 is formed on an FD 135.

As illustrated in FIG. 19B, in the pixel 121, the integrated gate electrode 301 is formed to be covered with the light shielding metal 185, without being drawn from the light shielding region as in the second method according to the related art. Because the contact portion 188-1 is formed on an upper portion of the integrated gate electrode 301, the light shielding metal digging portion 185*m* is formed in an end of the integrated gate electrode 301. Therefore, in the pixel 121, leakage of the light from the end of the integrated gate electrode 301 can be suppressed.

In the pixel 121, the contact portion 188-1 is not formed in the processing portion used in the third method according to the related art, that is, a processing portion formed to penetrate an interlayer insulating film 186, the light shielding metal 185 on the integrated gate electrode 301, and a liner film 184. That is, the contact portion 188-1 is formed on the light shielding metal 185. Therefore, in the pixel 121, leakage of the light from the upper side with respect to the integrated gate electrode 301 can be suppressed.

In this case, in a partial region between the PD 131 and the integrated gate electrode 301 in the light shielding metal digging portion 185*m* illustrated in FIG. 19B, a channel for transmission is formed. Hereinafter, a portion of the light shielding metal digging portion 185*m* in which the channel is formed is referred to as a channel forming portion 185*c*.

As a method of forming the channel in only the channel forming portion 185*c* of the light shielding metal digging portion 185*m*, a method of performing ion implantation or a method of thinly forming an oxide film for insulation is known. Thereby, a threshold potential Vth (that is, a threshold voltage Vth) of the channel forming portion 185*c* can be adjusted. Therefore, the threshold potential Vth of the channel forming portion 185*c* is adjusted to be lower than the threshold potential of the other region, so that the channel is formed in only the channel forming portion 185*c*.

As such, in the pixel 121, because the contact portion 188-1 can be formed on the light shielding metal 185, the leakage of the light can be further suppressed, as compared with the method according to the related art.

In the pixel 121, the contact portion 188-1 may be arranged at any position on the light shielding metal 185, in the case of the region on the integrated gate electrode 301. Therefore, in the pixel 121, a degree of freedom of the layout of the contact portion 188-1 or the necessary wiring line increases, as compared with the method according to the related art.

7. Seventh Embodiment

Configuration Example of Pixel According to Seventh Embodiment

FIG. 20 is a cross-sectional view and a top surface layout diagram of a pixel 121 according to the seventh embodiment. In FIG. 20, structural elements that are common to the structural elements of the pixel 121 of FIG. 12 are denoted with the same reference numerals and detailed explanation thereof is omitted.

FIG. 20A is a cross-sectional view taken along the line a-a' of the top surface layout diagram of the pixel 121 of FIG. 20B.

As illustrated in FIG. 20A, in the pixel 121, a gate electrode of a transmission transistor 132 and a gate electrode of a memory unit 133 are integrated with each other and is formed as an integrated gate electrode 311. In the pixel 121, a portion of the integrated gate electrode 311 is configured to dig into the semiconductor substrate 141. Therefore, the portion having the above configuration in the integrated gate electrode 311 is hereinafter referred to as an integrated gate electrode digging portion 311*m*. As a formation material of the integrated gate electrode 311 having the integrated gate electrode digging portion 311*m*, an electrode material having a light shielding characteristic is adopted.

In the pixel 121, a transmission path r12 from a PD 131 to the digging-type integrated gate electrode 311 is shown by an arrow. The transmission path r12 becomes a path that passes a surrounding portion of the integrated gate electrode digging portion 311*m*.

In the pixel 121, because the digging-type integrated gate electrode 311 has a light shielding characteristic, the light shielding metal 185 is opened and a contact portion 188-11 can be formed directly on the digging-type integrated gate electrode 311. Specifically, as illustrated in FIG. 20A, a hole that is formed to penetrate an interlayer insulating film 186, the light shielding metal 185, and a liner film 184 is formed as an opening 321. The contact portion 188-11 is connected directly to the digging-type integrated gate electrode 311 through the opening 321.

Thereby, the digging-type integrated gate electrode 311 is connected to a wiring line (not illustrated in the drawings) through the contact portion 188-1 and a voltage thereof is controlled, so that a channel for transmission is formed at a deep position of the semiconductor substrate 141. Therefore, transmission of charges from the PD 131 to the digging-type integrated gate electrode 301 is performed securely along the transmission path r12.

FIG. 20B is a top surface layout diagram of the pixel 121.

In the pixel 121, the contact portion 188-11 is formed in the opening 321 on the digging-type integrated gate electrode 311 covered with the light shielding metal 185. A portion of a gate electrode 173 is drawn and a contact portion 188-12 is formed. A contact portion 188-13 is formed on an FD 135.

As illustrated in FIG. 20B, in the pixel 121, the digging-type integrated gate electrode 311 is formed to be covered with the light shielding metal 185, without being drawn from the light shielding region as in the second method according to the related art. Because the contact portion 188-11 is formed on an upper portion of the digging-type integrated gate electrode 311, the light shielding metal digging portion 185*m* is formed in an end of the digging-type integrated gate electrode 311. Therefore, in the pixel 121, leakage of the light from the end of the digging-type integrated gate electrode 311 can be suppressed.

In the pixel 121, the contact portion 188-11 is formed on the digging-type integrated gate electrode 311 having the light shielding characteristic. Therefore, leakage of the light from the upper side with respect to the digging-type integrated gate electrode 311 can be suppressed.

As such, in the pixel 121, because the contact portion 188-11 can be formed on the digging-type integrated gate electrode 311 having the light shielding characteristic, the leakage of the light can be further suppressed, as compared with the method according to the related art.

In the pixel 121, the contact portion 188-11 may be arranged at any position on the light shielding metal 185, in the case of the region on the digging-type integrated gate electrode 311. Therefore, in the pixel 121, a degree of freedom of the layout of the contact portion 188-11 or the necessary wiring line increases, as compared with the method according to the related art.

The sixth and seventh embodiments and the method of arranging the contact portions 188 have been described. Each of the integrated gate electrode 301 according to the sixth embodiment and the digging-type integrated gate electrode 311 according to the seventh embodiment may be configured to be separated into the gate electrode of the transmission transistor 132 and the gate electrode of the memory unit 133.

Therefore, a pixel 121 in which the integrated gate electrode 301 according to the sixth embodiment is separated into the gate electrode of the transmission transistor 132 and the gate electrode of the memory unit 133 and a method of arranging contact portions 188 in the pixel 121 will be described as an eighth embodiment with reference to FIG. 21. In addition, a pixel 121 in which the digging-type integrated gate electrode 311 according to the seventh embodiment is separated into the gate electrode of the transmission transistor 132 and the gate electrode of the memory unit 133 and a method of arranging contact portions 188 in the pixel 121 will be described as a ninth embodiment with reference to FIG. 22.

8. Eighth Embodiment

Configuration Example of Pixel According to Eighth Embodiment

Figure 21:
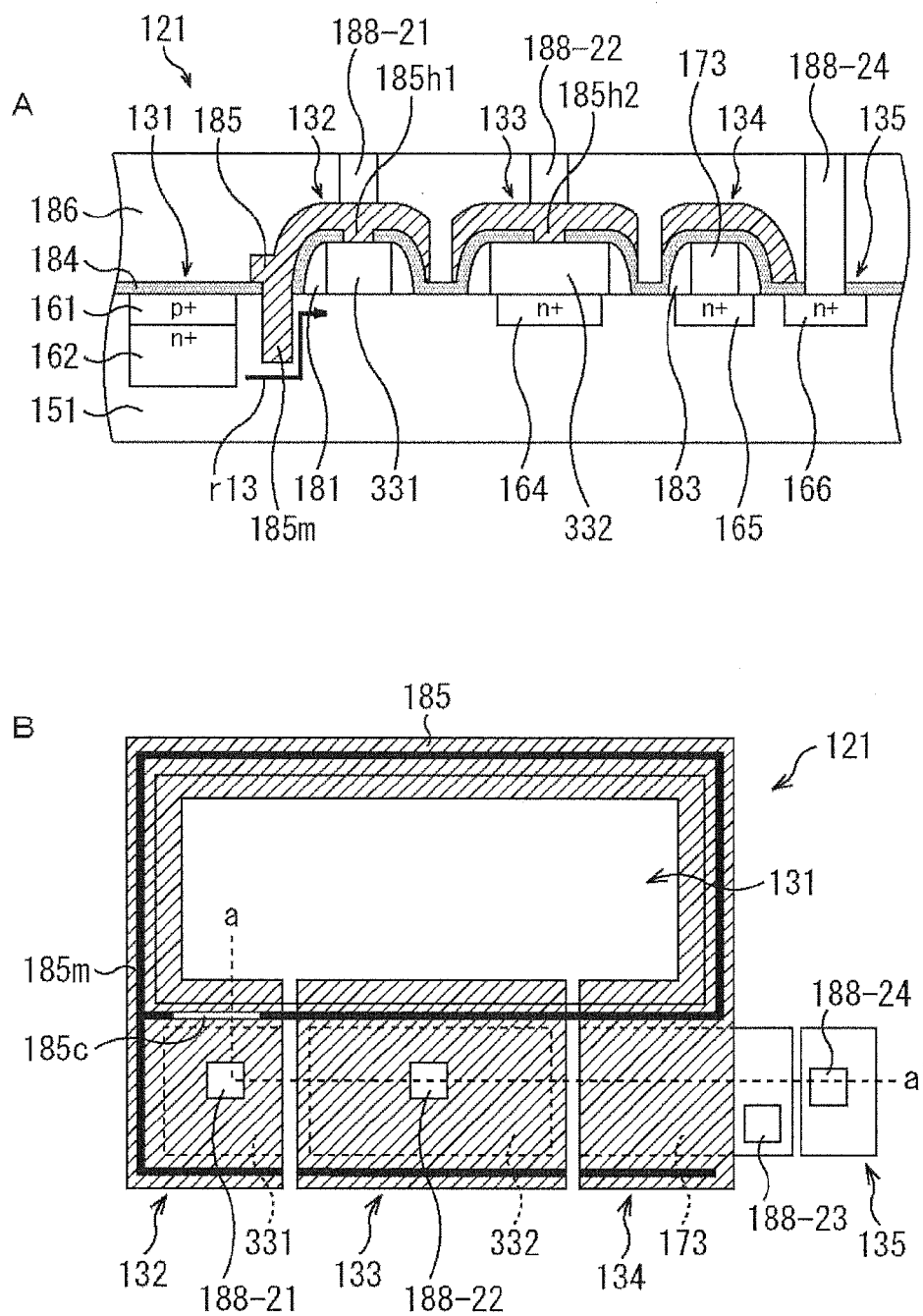
FIG. 21 is a cross-sectional view of a pixel according to an eighth embodiment and a top surface layout diagram of an arrangement of contact portions.

FIG. 21 is a cross-sectional view of a pixel 121 according to the eighth embodiment and a top surface layout diagram illustrating an arrangement of contact portions in the pixel 121.

FIG. 21A is a cross-sectional view taken along the line a-a' of the top surface layout diagram of the pixel 121 of FIG. 21B.

As illustrated in FIG. 21A, in the pixel 121, the integrated gate electrode 301 according to the sixth embodiment illustrated in FIG. 19 is separated into a gate electrode 331 of a transmission transistor 132 and a gate electrode 332 of a memory unit 133. In the pixel 121, a light shielding metal 185 has a digging-type structure with a light shielding metal digging portion 185*m*. In the pixel 121, the digging-type light shielding metal 185 and the gate electrode 331 are connected by a light shielding metal connecting portion 185*h*1. In the pixel 121, the light shielding metal 185 on the gate electrode 332 and the gate electrode 332 are connected by a light shielding metal connecting portion 185*h*2.

In the pixel 121, a transmission path r13 from a PD 131 to the gate electrode 332 is shown by an arrow. The transmission path r13 passes a surrounding portion of the light shielding metal digging portion 185*m*.

In the pixel 121, a contact portion 188-21 is formed on the light shielding metal 185 covering the gate electrode 331. That is, the gate electrode 331 is connected to a wiring line (not illustrated in the drawings) through the contact portion 188-21 formed on the light shielding metal 185 and a voltage thereof is controlled. Because the light shielding metal 185 is connected to the gate electrode 331, a channel for transmission is formed in the light shielding metal digging portion 185m. Thereby, transmission of charges from the PD 131 to the gate electrode 332 is performed securely along the transmission path r13.

In the pixel 121, a contact portion 188-22 is formed on the light shielding metal 185 covering the gate electrode 332. That is, the gate electrode 332 is connected to a wiring line (not illustrated in the drawings) through the contact portion 188-22 formed on the light shielding metal and a voltage thereof is controlled.

FIG. 21B is a top surface layout diagram of the pixel 121.

In the pixel 121, the contact portion 188-21 is formed on the gate electrode 331 covered with the light shielding metal 185. The contact portion 188-22 is formed on the gate electrode 332 covered with the light shielding metal 185. A portion of a gate electrode 173 is drawn from a light shielding region and a contact portion 188-23 is formed. A contact portion 188-24 is formed on an FD 135.

In the pixel 121, the light shielding metal 185 is not formed between the gate electrode 331 and the gate electrode 332 and between the gate electrode 332 and the gate electrode 173. This is because voltages of the adjacent gate electrodes may be different.

As illustrated in FIG. 21B, in the pixel 121, the gate electrode 332 is not drawn from the light shielding region, similar to the pixel 121 of FIG. 19. Therefore, leakage of the light from the end of the gate electrode 332 can be suppressed. In the pixel 121, the contact portion 188-22 is formed on the light shielding metal 185, similar to the pixel 121 of FIG. 19. Therefore, the leakage of the light from the upper side with respect to the gate electrode 332 can be suppressed.

A channel forming portion 185c is formed between the PD 131 and the gate electrode 331. Because the method of forming the channel in the channel forming portion 185c is described above with reference to FIG. 19, explanation thereof is omitted.

In the pixel 121 in which the gate electrode 331 and the gate electrode 332 are separated from each other, a degree of freedom of the layout of the contact portions 188-21 and 188-22 or the necessary wiring line decreases, as compared with the pixel 121 having the integrated gate electrode 301 of FIG. 19. However, in the pixel 121, because the contact portion 188-22 can be formed on the light shielding metal 185, the leakage of the light can be further suppressed, as compared with the method according to the related art.

9. Ninth Embodiment

Configuration Example of Pixel According to Ninth Embodiment

FIG. 22 is a cross-sectional view of a pixel 121 according to the ninth embodiment and a top surface layout diagram illustrating an arrangement of contact portions in the pixel 121.

FIG. 22A is a cross-sectional view taken along the line a-a' of the top surface layout diagram of the pixel 121 of FIG. 22B.

As illustrated in FIG. 22A, in the pixel 121, the digging-type integrated gate electrode 311 having the light shielding characteristic according to the seventh embodiment illustrated in FIG. 20 is separated into a gate electrode 341 of a transmission transistor 132 and a gate electrode 342 of a memory unit 133. In the pixel 121, the gate electrode 341 has a digging-type structure with a gate electrode digging portion 341m. In the pixel 121, as a formation material of the gate electrodes 341 and 342, an electrode material having a light shielding characteristic is adopted.

In the pixel 121, a transmission path r14 from a PD 131 to the gate electrode 342 is shown by an arrow. The transmission path r14 becomes a path that passes a surrounding portion of the gate electrode digging portion 341m.

In the pixel 121, because the digging-type gate electrode 341 has a light shielding characteristic, a light shielding metal 185 is opened and a contact portion 188-31 can be formed directly on the gate electrode 341. That is, the contact portion 188-31 is connected directly to the gate electrode 341 through an opening 351-1 formed on the gate electrode 341.

Thereby, the digging-type gate electrode 341 is connected to a wiring line (not illustrated in the drawings) through the contact portion 188-31 and a channel for transmission is formed at a deep position of a semiconductor substrate 141. Therefore, transmission of charges from the PD 131 to the digging-type gate electrode 341 is performed securely along the transmission path r14.

Because the gate electrode 342 also has the same light shielding characteristic, a contact portion 188-32 that is inserted from an opening 351-2 formed on the gate electrode 342 is connected directly to the gate electrode 342.

FIG. 22B is a top surface layout diagram of the pixel 121.

In the pixel 121, the contact portion 188-31 is formed in the opening 351-1 on the digging-type gate electrode 341 covered with the light shielding metal 185. The contact portion 188-32 is formed to be inserted into the opening 351-2 on the gate electrode 342 covered with the light shielding metal 185. A portion of a gate electrode 173 is drawn from a light shielding region and a contact portion 188-33 is formed. A contact portion 188-34 is formed on an FD 135.

As illustrated in FIG. 22B, in the pixel 121, the gate electrode 342 is formed to be covered with the light shielding metal 185, without being drawn from the light shielding region as in the second method according to the related art. Because the contact portion 188-32 is formed on an upper portion of the gate electrode 342, a light shielding metal digging portion 185m is formed in an end of the gate electrode 342. Therefore, in the pixel 121, leakage of the light from the end of the gate electrode 342 can be suppressed.

In the pixel 121, the contact portion 188-32 is formed on the gate electrode 342 having the light shielding characteristic. Therefore, leakage of the light from the upper side with respect to the gate electrode 342 can be suppressed.

In the pixel 121 in which the gate electrode 341 and the gate electrode 342 are separated from each other, a degree of freedom of the layout of the contact portions 188-31 and 188-32 or the necessary wiring line decreases, as compared with the pixel 121 having the integrated gate electrode 311 of FIG. 20. However, in the pixel 121, because the contact portion 188-32 can be formed on the light shielding metal 185, the leakage of the light can be further suppressed, as compared with the method according to the related art.

In the pixel 121 according to the fifth embodiment, even though the contact portion 188 is formed on the light shielding metal 185, similar to FIGS. 19 and 21, the contact portion 188 may be connected directly to the gate electrode 231 through the opening formed in the light shielding metal 185, similar to FIGS. 20 and 22.

10. Tenth Embodiment

Configuration Example of Pixel According to Tenth Embodiment

Next, a pixel 121 that is obtained by applying a method of arranging contact portions 188, which has considered a second reset transistor 139, to the pixel 121 according to the sixth embodiment having the digging-type light shielding metal 185 will be described as a tenth embodiment. As described above, the second reset transistor 139 functions as an overflow gate to, when charges of an amount equal to or more than a predetermined charge amount are generated in a PD 131, discharge the charges to a power supply potential VDD.

FIG. 23 is a cross-sectional view and a top surface layout diagram of the pixel 121 according to the sixth embodiment illustrated in FIG. 19, which includes the second reset transistor 139. In FIG. 23, structural elements that are common to the structural elements of the pixel 121 of FIG. 19 are denoted with the same reference numerals and detailed explanation thereof is omitted.

FIG. 23A is a cross-sectional view of the case in which the second reset transistor 139 is included in the pixel 121 according to the sixth embodiment illustrated in FIG. 19. Specifically, FIG. 23A illustrates a cross-sectional view taken along the line a-a' of the top surface layout diagram of the pixel 121 of FIG. 23B.

As illustrated in FIG. 23A, in the pixel 121, a digging-type light shielding metal 185 having a light shielding metal digging portion 185m is formed to cover an integrated gate electrode 301. The digging-type light shielding metal 185 and the integrated gate electrode 301 are connected by a light shielding metal connecting portion 185h not illustrated in the drawings.

In the pixel 121, a transmission path r11 from the PD 131 to the integrated gate electrode 301 is shown by an arrow. The transmission path r11 becomes a path that passes a surrounding portion of the light shielding metal digging portion 185m.

In the pixel 121, the second reset transistor 139 is formed. Specifically, a gate electrode 361 of the second reset transistor 139 is formed through a gate insulating film (not illustrated in the drawings) formed on a surface of a semiconductor substrate 41. A sidewall 371 is formed to surround the side of the gate electrode 361 and a liner film 184, the light shielding metal 185, and an interlayer insulating film 186 are formed to be sequentially stacked.

In the pixel 121, the digging-type light shielding metal 185 is not preferably formed in a channel forming region with respect to the second reset transistor 139, such that transmission of unnecessary charges from the PD 131 to the second reset transistor 139 is facilitated.

The digging-type light shielding metal 185 may be formed in the channel forming region with respect to the second reset transistor 139. In this case, however, it is necessary to form the digging-type light shielding metal 185 to have the depth smaller than the depth of the peripheral light shielding metal digging portion 185m so as not to affect the transmission of the unnecessary charges. For example, patterning different from patterning of the peripheral light shielding metal digging portion 185m is performed, so that the digging-type light shielding metal 185 can be formed between the PD 131 and the second reset transistor 139.

The gate electrode 361 may be formed to have a digging-type structure. In this case, voltage control different from voltage control of the light shielding metal 185 right above the digging-type gate electrode 361 is performed with respect to the digging-type gate electrode 361, so that a channel for transmission can be formed in the digging-type gate electrode 361. Thereby, the transmission of the unnecessary charges from the PD 131 to the second reset transistor 139 is performed. When the digging-type gate electrode 351 is used, the leakage of the light can be further suppressed.

[Configuration Example of Imaging Apparatus mounted to Electronic Apparatus]

Figure 24:
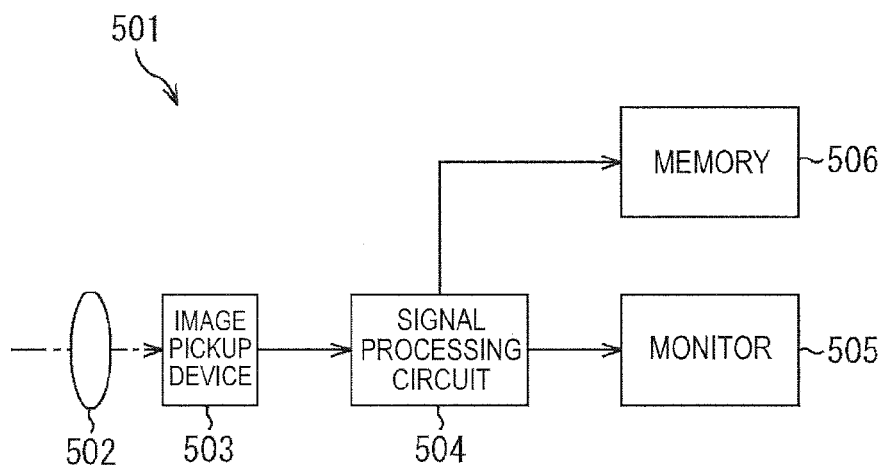
FIG. 24 is a block diagram illustrating a configuration example of an imaging apparatus mounted to an electronic apparatus.

FIG. 24 is a block diagram illustrating a configuration example of an imaging apparatus mounted to an electronic apparatus.

As illustrated in FIG. 24, an imaging apparatus 501 includes an optical system 502, an image pickup device 503, a signal processing circuit 504, a monitor 505, and a memory 506 and can image a still image and a moving image.

The optical system 502 has one or more lenses. The optical system 502 guides image light (incident light) from an object to the image pickup device 503 and forms an image on a light reception surface (sensor unit) of the image pickup device 503.

As the image pickup device 503, the image pickup device 111 having the pixels 121 described above is applied. In the image pickup device 503, electrons are accumulated during a constant period, according to the image formed on the light reception surface through the optical system 502. A signal according to the electrons accumulated in the image pickup device 503 is supplied to the signal processing circuit 504.

The signal processing circuit 504 executes various signal processing with respect to the signal charges output from the image pickup device 503. Image data that is obtained by executing the signal processing by the signal processing circuit 504 is supplied to the monitor 505 and is displayed or is supplied to the memory 506 and is stored.

In the imaging apparatus 501 configured as described above, the image pickup device 111 including the pixels 121 described above is applied as the image pickup device 503, so that both suppression of smear and an excellent transmission characteristic can be realized and superior image quality can be obtained.

It should be understood by those skilled in the art that various modifications, combinations, sub-combinations and alterations may occur depending on design requirements and other factors insofar as they are within the scope of the appended claims or the equivalents thereof Additionally, the present technology may also be configured as below.

(1) A solid-state image pickup device including:
   a semiconductor substrate; and
   a plurality of pixel portions that are provided on the semiconductor substrate,
   wherein each of the pixel portions includes
   a photoelectric converting unit that generates a charge on the basis of incident light,
   a memory unit that accumulates the charge generated by the photoelectric converting unit,
   a light shielding portion that shields at least the memory unit from light,
   a digging portion that digs into the semiconductor substrate between the photoelectric converting unit and the memory unit and is formed of a light shielding material, and
   a transmitting unit that transmits the charge from the photoelectric converting unit to the memory unit, by forming a channel for transmission in the digging portion.

(2) The solid-state image pickup device according to (1),
   wherein the digging portion is formed as a part of the light shielding portion between the photoelectric converting unit and the transmitting unit, wherein the transmitting unit is a transistor having a gate electrode, and
wherein the gate electrode and the light shielding portion are connected to form the channel for the transmission.
(3) The solid-state image pickup device according to (1) or (2),
wherein each of the pixel portions further includes a contact portion that connects the gate electrode to a wiring line, and
wherein the contact portion is formed on the light shielding portion.
(4) The solid-state image pickup device according to any one of (1) to (3),
wherein the transmitting unit is a transistor having a gate electrode functioning as the digging portion.
(5) The solid-state image pickup device according to any one of (1) to (4),
wherein each of the pixel portions further includes a contact portion that connects the gate electrode to a wiring line, and
wherein the contact portion is formed on the gate electrode through a hole formed in the light shielding portion.
(6) The solid-state image pickup device according to any one of (1) to (5),
wherein the photoelectric converting unit is formed to be stacked in a plurality of steps in the semiconductor substrate.
(7) The solid-state image pickup device according to any one of (1) to (6),
wherein the transmitting unit is a transistor having a gate electrode,
wherein the digging portion has a first digging portion formed as a part of the light shielding portion between the photoelectric converting unit and the transmitting unit and a second digging portion formed in the gate electrode, and
wherein the gate electrode and the light shielding portion are connected to form the channel for the transmission.
(8) The solid-state image pickup device according to any one of (1) to (7),
wherein each of the pixel portions further includes a contact portion that connects the gate electrode to a wiring line, and
wherein the contact portion is formed on the light shielding portion.
(9) The solid-state image pickup device according to any one of (1) to (8),
wherein each of the pixel portions further includes a contact portion that connects the gate electrode to a wiring line, and
wherein the contact portion is formed on the gate electrode through a hole formed in the light shielding portion.
(10) The solid-state image pickup device according to any one of (1) to (9),
wherein the digging portion is formed to surround the photoelectric converting unit, and
wherein the channel for the transmission in the transmitting unit is formed in a region of the digging portion between the photoelectric converting unit and the memory unit.
(11) The solid-state image pickup device according to any one of (1) to (10),
wherein each of the pixel portions further includes a transistor having an overflow gate that, when charges of an amount equal to or more than a predetermined charge amount are generated in the photoelectric converting unit, discharges a part of the charges to a power supply potential, and
wherein the digging portion is not formed or digs to be shallower than another place, in a channel forming region with respect to the overflow gate.
(12) The solid-state image pickup device according to any one of (1) to (11),
wherein each of the pixel portions further includes a transistor having an overflow gate that, when charges of an amount equal to or more than a predetermined charge amount are generated in the photoelectric converting unit, discharges a part of the charges to a power supply potential, and
wherein the digging portion is further formed in the overflow gate.

The present disclosure can be applied to various electronic apparatuses, such as an imaging system such as a digital still camera and a digital video camera, a mobile phone including an imaging function, and other apparatuses including an imaging function.

The present disclosure contains subject matter related to that disclosed in Japanese Priority Patent Application JP 2012-157072 filed in the Japan Patent Office on Jul. 13, 2012, the entire content of which is hereby incorporated by reference.

What is claimed is:

1. A solid-state image pickup device comprising:
a semiconductor substrate; and
a plurality of pixel portions that are provided on the semiconductor substrate,
wherein each of the pixel portions includes
a photoelectric converting unit that generates a charge on the basis of incident light,
a memory unit that accumulates the charge generated by the photoelectric converting unit,
a light shielding portion that shields at least the memory unit from light,
a digging portion that digs into the semiconductor substrate between the photoelectric converting unit and the memory unit and is formed of a light shielding material, and
a transmitting unit that transmits the charge from the photoelectric converting unit to the memory unit, by forming a channel for transmission in the digging portion.

2. The solid-state image pickup device according to claim 1,
wherein the digging portion is formed as a part of the light shielding portion between the photoelectric converting unit and the transmitting unit,
wherein the transmitting unit is a transistor having a gate electrode, and
wherein the gate electrode and the light shielding portion are connected to form the channel for the transmission.

3. The solid-state image pickup device according to claim 2,
wherein each of the pixel portions further includes a contact portion that connects the gate electrode to a wiring line, and
wherein the contact portion is formed on the light shielding portion.

4. The solid-state image pickup device according to claim 1,
wherein the transmitting unit is a transistor having a gate electrode functioning as the digging portion.

5. The solid-state image pickup device according to claim 4,
wherein each of the pixel portions further includes a contact portion that connects the gate electrode to a wiring line, and
wherein the contact portion is formed on the gate electrode through a hole formed in the light shielding portion.

6. The solid-state image pickup device according to claim 1,
wherein the photoelectric converting unit is formed to be stacked in a plurality of steps in the semiconductor substrate.

7. The solid-state image pickup device according to claim 1,
wherein the transmitting unit is a transistor having a gate electrode,
wherein the digging portion has a first digging portion formed as a part of the light shielding portion between the photoelectric converting unit and the transmitting unit and a second digging portion formed in the gate electrode, and
wherein the gate electrode and the light shielding portion are connected to form the channel for the transmission.

8. The solid-state image pickup device according to claim 7,
wherein each of the pixel portions further includes a contact portion that connects the gate electrode to a wiring line, and
wherein the contact portion is formed on the light shielding portion.

9. The solid-state image pickup device according to claim 7,
wherein each of the pixel portions further includes a contact portion that connects the gate electrode to a wiring line, and
wherein the contact portion is formed on the gate electrode through a hole formed in the light shielding portion.

10. The solid-state image pickup device according to claim 1,
wherein the digging portion is formed to surround the photoelectric converting unit, and
wherein the channel for the transmission in the transmitting unit is formed in a region of the digging portion between the photoelectric converting unit and the memory unit.

11. The solid-state image pickup device according to claim 10,
wherein each of the pixel portions further includes a transistor having an overflow gate that, when charges of an amount equal to or more than a predetermined charge amount are generated in the photoelectric converting unit, discharges a part of the charges to a power supply potential, and
wherein the digging portion is not formed or digs to be shallower than another place, in a channel forming region with respect to the overflow gate.

12. The solid-state image pickup device according to claim 10,
wherein each of the pixel portions further includes a transistor having an overflow gate that, when charges of an amount equal to or more than a predetermined charge amount are generated in the photoelectric converting unit, discharges a part of the charges to a power supply potential, and
wherein the digging portion is further formed in the overflow gate.

13. A method of manufacturing a solid-state image pickup device, comprising:
manufacturing a semiconductor substrate; and
manufacturing a plurality of pixel portions provided on the semiconductor substrate,
wherein each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

14. An electronic apparatus comprising:
a solid-state image pickup device,
wherein the solid-state image pickup device includes a semiconductor substrate and a plurality of pixel portions that are provided on the semiconductor substrate, and
wherein each of the pixel portions includes a photoelectric converting unit that generates a charge on the basis of incident light, a memory unit that accumulates the charge generated by the photoelectric converting unit, a light shielding portion that shields at least the memory unit from light, a digging portion that digs into the semiconductor substrate between the photoelectric converting unit and the memory unit and is formed of a light shielding material, and a transmitting unit that transmits the charge from the photoelectric converting unit to the memory unit, by forming a channel for transmission in the digging portion.

* * * * *